US010056535B2

(12) United States Patent
Chang et al.

(10) Patent No.: US 10,056,535 B2
(45) Date of Patent: Aug. 21, 2018

(54) LIGHT EMITTING DEVICE WITH A LIGHT EMITTING JUNCTION FORMED BY STACKING SEMICONDUCTOR LAYERS

(71) Applicant: AU Optronics Corporation, Hsin-Chu (TW)

(72) Inventors: Cheng-Chieh Chang, Hsin-Chu (TW); Tsung-Tien Wu, Hsin-Chu (TW); Wen-Wei Yang, Hsin-Chu (TW); Tsung-Yi Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/404,656

(22) Filed: Jan. 12, 2017

(65) Prior Publication Data

US 2017/0222108 A1    Aug. 3, 2017

(30) Foreign Application Priority Data

Jan. 29, 2016  (TW) .............................. 105102966 A

(51) Int. Cl.
*H01L 33/00* (2010.01)
*H01L 33/62* (2010.01)
(Continued)

(52) U.S. Cl.
CPC .............. *H01L 33/62* (2013.01); *H01L 33/38* (2013.01); *H01L 33/385* (2013.01); *H01L 33/44* (2013.01);
(Continued)

(58) Field of Classification Search
CPC ................................ H01L 33/62; H01L 33/38
(Continued)

(56) References Cited

U.S. PATENT DOCUMENTS

| 5,866,439 A | 2/1999 | Nobori et al. |
| 6,717,362 B1 | 4/2004 | Lee et al. |

(Continued)

FOREIGN PATENT DOCUMENTS

| CN | 101162754 A | 4/2008 |
| CN | 104952899 A | 9/2015 |

(Continued)

OTHER PUBLICATIONS

State Intellectual Property Office of the People's Republic of China , "Office Action", dated Sep. 21, 2017.

(Continued)

*Primary Examiner* — Jami M Valentine
(74) *Attorney, Agent, or Firm* — WPAT, PC

(57) ABSTRACT

A light emitting device includes a substrate, a light emitting chip, a first electrode, and a second electrode. The light emitting chip includes a first and a second semiconductor layers. The first semiconductor layer is disposed on the substrate. The second semiconductor layer is stacked on the first semiconductor layer and forms a light emitting junction with the first semiconductor layer. The first electrode connects to the first semiconductor layer and the second electrode connects to the second semiconductor layer. The light emitting device may further include a transparent layer that is disposed on the substrate and surrounds and contacts the lateral of the light emitting chip. A refraction index of the transparent layer is between a refraction index of the light emitting chip and that of a vacuum. The first electrode may penetrate the second semiconductor layer to connect to the first semiconductor.

12 Claims, 47 Drawing Sheets

(51) Int. Cl.
   *H01L 33/38*   (2010.01)
   *H01L 33/44*   (2010.01)
(52) U.S. Cl.
   CPC ............... *H01L 2933/0016* (2013.01); *H01L 2933/0025* (2013.01); *H01L 2933/0066* (2013.01)
(58) Field of Classification Search
   USPC ............................................ 257/99; 438/149
   See application file for complete search history.

(56) References Cited

U.S. PATENT DOCUMENTS

| 7,872,277 | B2 | 1/2011 | Hsu et al. | |
|---|---|---|---|---|
| 7,884,543 | B2 | 2/2011 | Doi | |
| 2002/0163808 | A1* | 11/2002 | West | F21V 5/04 362/255 |
| 2002/0163810 | A1* | 11/2002 | West | H01L 33/58 362/307 |
| 2004/0070004 | A1* | 4/2004 | Eliashevich | H01L 33/22 257/200 |
| 2013/0193464 | A1 | 8/2013 | Bae et al. | |
| 2014/0252311 | A1 | 9/2014 | Kimura et al. | |

FOREIGN PATENT DOCUMENTS

| TW | 201336121 | 9/2013 |
|---|---|---|
| TW | 201501347 | 1/2015 |
| TW | 201532308 | 8/2015 |
| TW | 201532308 A | 8/2015 |

OTHER PUBLICATIONS

Taiwan Intellectual Property Office, "Office Action", dated Oct. 21, 2016.

\* cited by examiner

LIGHT EMITTING DEVICE WITH A LIGHT EMITTING JUNCTION FORMED BY STACKING SEMICONDUCTOR LAYERS

CROSS-REFERENCE TO RELATED APPLICATION

This application claims priority to Taiwan application number 105102966, filed Jan. 29, 2016, the contents of which are incorporated hereby by reference.

TECHNICAL FIELD

The present invention relates to a light emitting device.

BACKGROUND

With the advances of times, the illumination means evolve from light sources for emitting light through article burning, such as a torch, an oil lamp, and a candle, to light sources for emitting light through being energized, such as an incandescent bulb, a fluorescent tube, an energy saving bulb, and a light emitting diode. Because a light emitting device of the light emitting diode has a small volume and lower power consumption, currently many relevant practitioners devote themselves into the development of the relevant field.

In a light emitting device with a light emitting diode, semiconductor layers of different types of a light emitting chip are energized such that a light emitting junction between the semiconductor layers of different types emit light. The light emitted by the light emitting junction can be radiated in various directions, but a user usually uses light emitted by the light emitting chip in front of the light emitting device. Thus, front light output efficiency is often discussed when light output efficiency of a light emitting device is evaluated. Because of light diffraction or the ambient environment of the light emitting chip, light may also be emitted from the light emitting junction from a lateral of the light emitting chip and may possibly contribute to the front light output efficiency of the light emitting device to a certain extent.

However, when electrodes are configured to be electrically connected to the light emitting chip and energize the light emitting chip, the electrodes cover the lateral of the light emitting chip so that a partial range of the lateral of the light emitting chip for emitting light is shielded by the electrodes, thereby reducing the front light output efficiency of the light emitting device.

SUMMARY

Certain embodiments provides a light emitting device and a manufacturing method thereof.

The certain embodiment provides a light emitting device, comprising a substrate, a light emitting chip, a transparent layer, a first electrode, and a second electrode. The light emitting chip comprises a first semiconductor layer and a second semiconductor layer. The first semiconductor layer is disposed above the substrate. The second semiconductor layer is stacked above the first semiconductor layer and forms a light emitting junction with the first semiconductor layer. The transparent layer is disposed above the substrate and surrounds and contacts the lateral of the light emitting chip. The transparent layer exhibits a refraction index between that of the light emitting chip and that of a vacuum. The first electrode is electrically connected to the first semiconductor layer. The second electrode is electrically connected to the second semiconductor layer.

Another certain embodiment provides a light emitting device, comprising a substrate, a light emitting chip, a first electrode, and a second electrode. The light emitting chip comprises a first semiconductor layer and a second semiconductor layer. The first semiconductor layer is disposed above the substrate. The second semiconductor layer is stacked above the first semiconductor layer and forms a light emitting junction with the first semiconductor layer. The first electrode comprises a first contact portion and a first extension portion. The first contact portion penetrates the second semiconductor layer and is electrically connected to the first semiconductor layer, and is electrically isolated from the second semiconductor layer at a position where the first contact portion passes through the second semiconductor layer. The first extension portion is stacked on the first contact portion and the second semiconductor layer, and is electrically isolated from the second semiconductor layer at a position where the first extension portion is stacked on the second semiconductor layer. The second electrode comprises a second contact portion and a second extension portion. The second contact portion is stacked on the second semiconductor layer, electrically connected to the second semiconductor layer, and is electrically isolated from the first electrode. The second extension portion is stacked on the second contact portion.

Another certain embodiment provides a manufacturing method of a light emitting device, comprising the following steps: providing a substrate; disposing a light emitting chip on the substrate, wherein the light emitting chip comprises a first semiconductor layer and a second semiconductor layer; the first semiconductor layer is disposed on the substrate, and the second semiconductor layer is stacked on the first semiconductor layer and forms a light emitting junction with the first semiconductor layer; forming an opening on the second semiconductor layer, wherein the opening passes through the second semiconductor layer and extends into the first semiconductor layer; forming a first insulating layer on an inner wall of the opening; forming a first contact portion in the opening, wherein the first contact portion is electrically connected to the first semiconductor layer, and the first insulating layer electrically isolates the first contact portion from the second semiconductor layer; forming a second insulating layer on the second semiconductor layer; forming a second contact portion on the second semiconductor layer, wherein the second contact portion is electrically connected to the second semiconductor layer; forming a first extension portion on the second insulating layer, wherein the first contact portion is electrically connected to the first extension portion, and the second insulating layer electrically isolates the first extension portion from the second semiconductor layer; forming a second extension portion on the second contact portion, and the second extension portion is electrically connected to the second contact portion, wherein the first contact portion and the first extension portion form a first electrode, and the second contact portion and the second extension portion form a second electrode.

The light emitting device and the manufacturing method according to the certain embodiments are devised to provide a better performance.

The above summary and the following detailed description are intended to demonstrate and explain the exemplary embodiments.

BRIEF DESCRIPTIONS OF THE DRAWINGS

FIG. 4A, FIG. 4C, FIG. 4E, FIG. 4G, FIG. 4I, FIG. 4K, FIG. 4M, FIG. 4O, and FIG. 4Q are schematic top-view drawings showing a manufacturing process of another aspect of a light emitting device according to another embodiment.

FIG. 4B, FIG. 4D, FIG. 4F, FIG. 4H, FIG. 4J, FIG. 4L, FIG. 4N, FIG. 4P, and FIG. 4R are respective schematic cross-sectional side-view drawings of the light emitting device in FIG. 4A, FIG. 4C, FIG. 4E, FIG. 4G, FIG. 4I, FIG. 4K, FIG. 4M, FIG. 4O, and FIG. 4Q.

Figure 5:
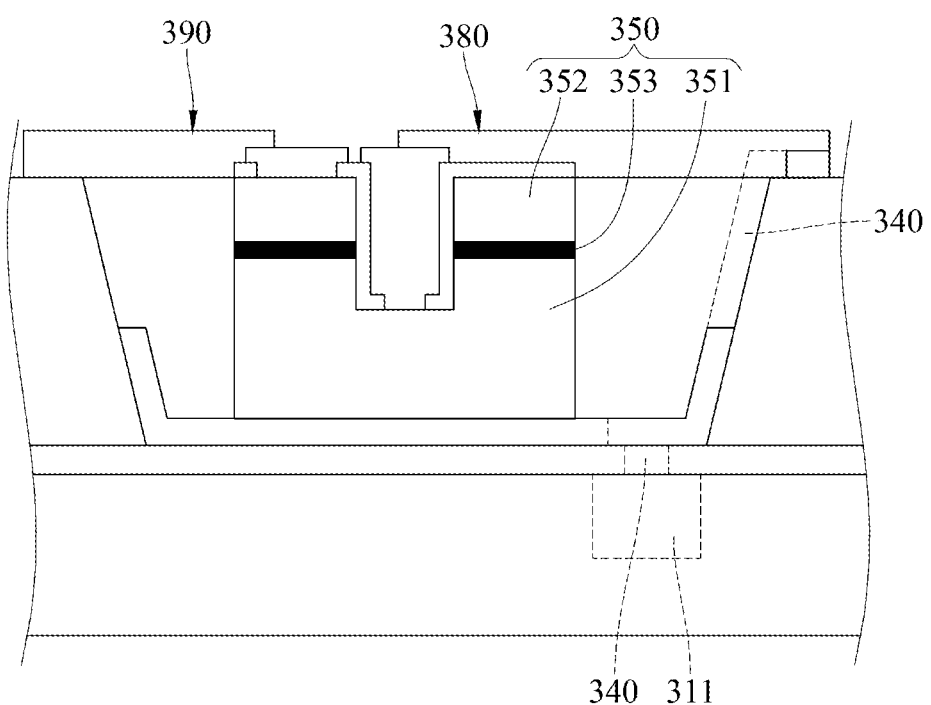

FIG. 5 is a schematic cross-sectional side-view drawing of a light emitting device according to another embodiment.

Figure 6:
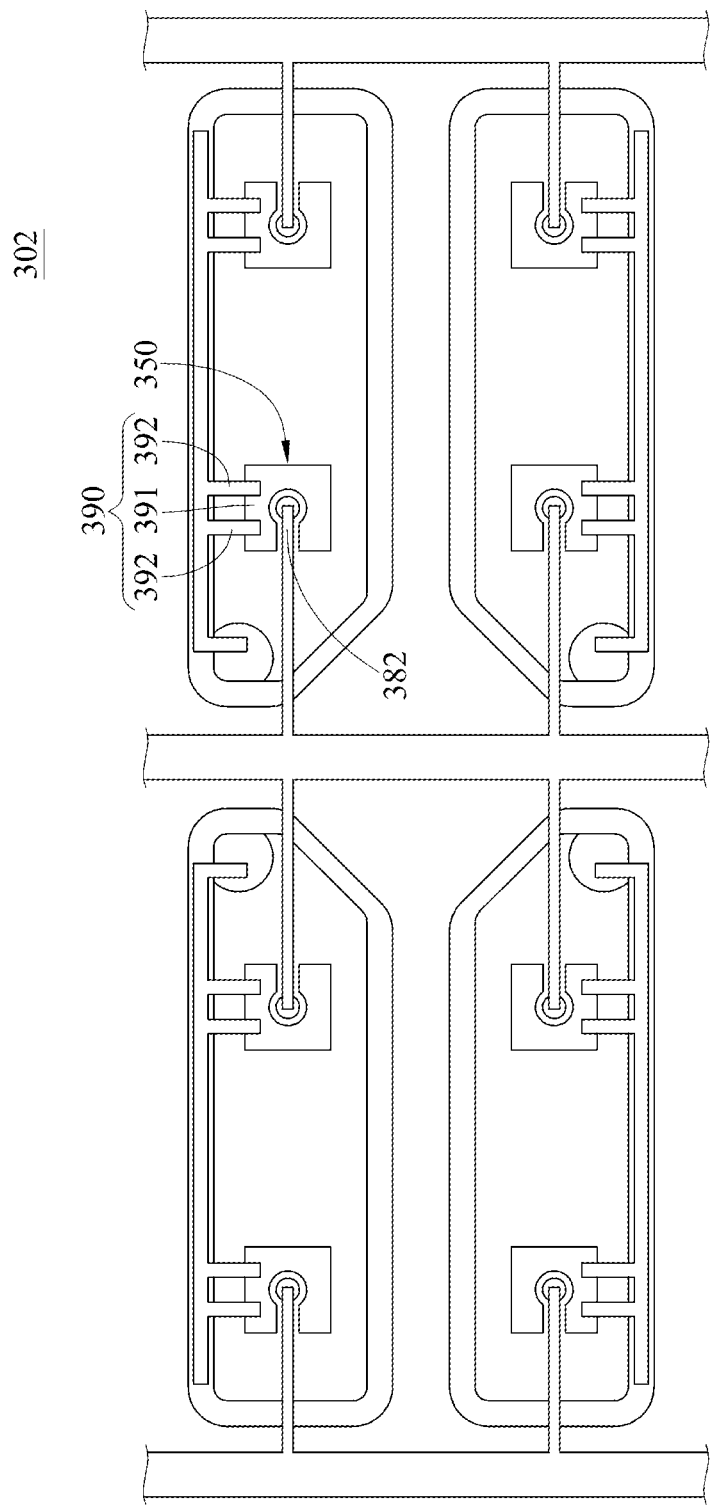

FIG. 6 is a schematic top-view drawing of a light emitting device according to another embodiment.

Figure 7A:
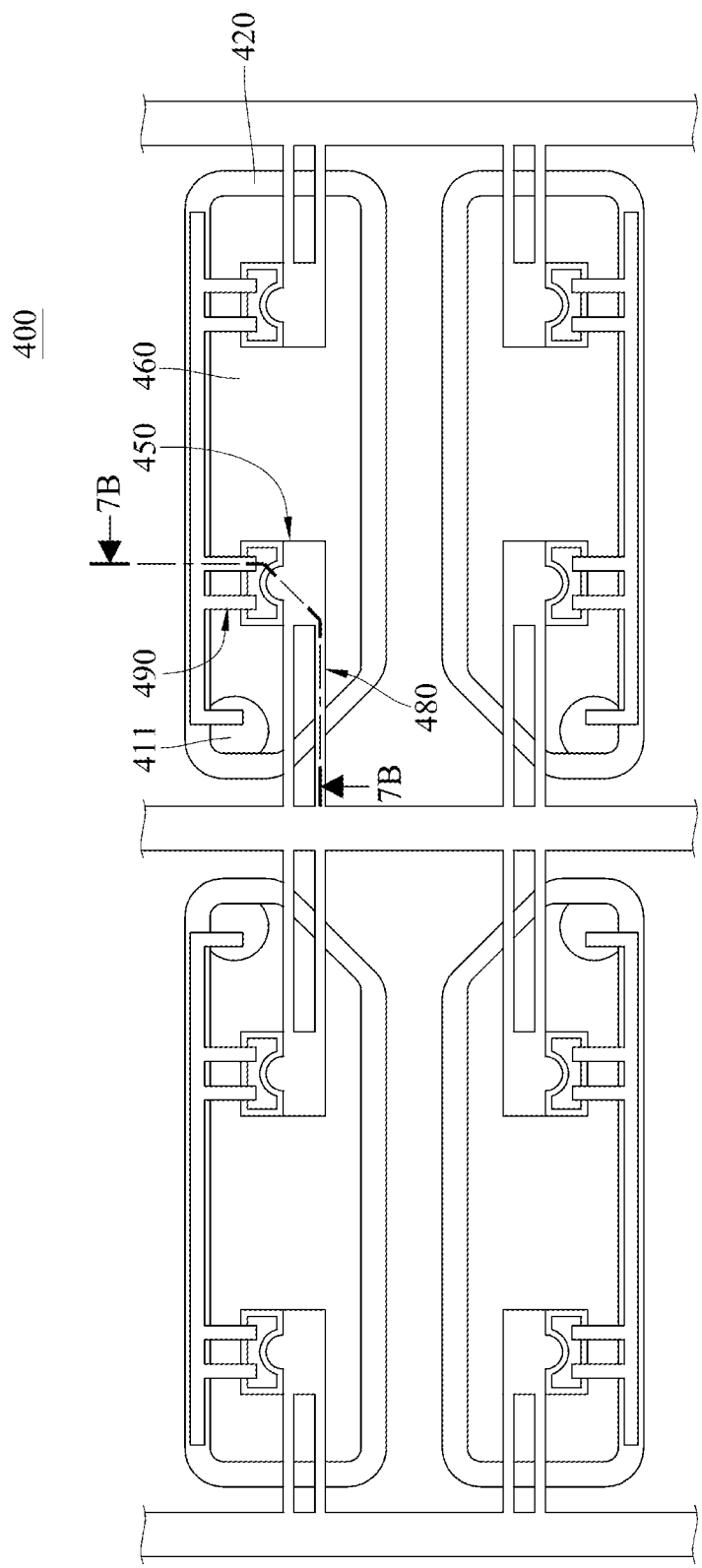

FIG. 7A is a schematic top-view drawing of an aspect of a light emitting device according to another embodiment.

Figure 7B:
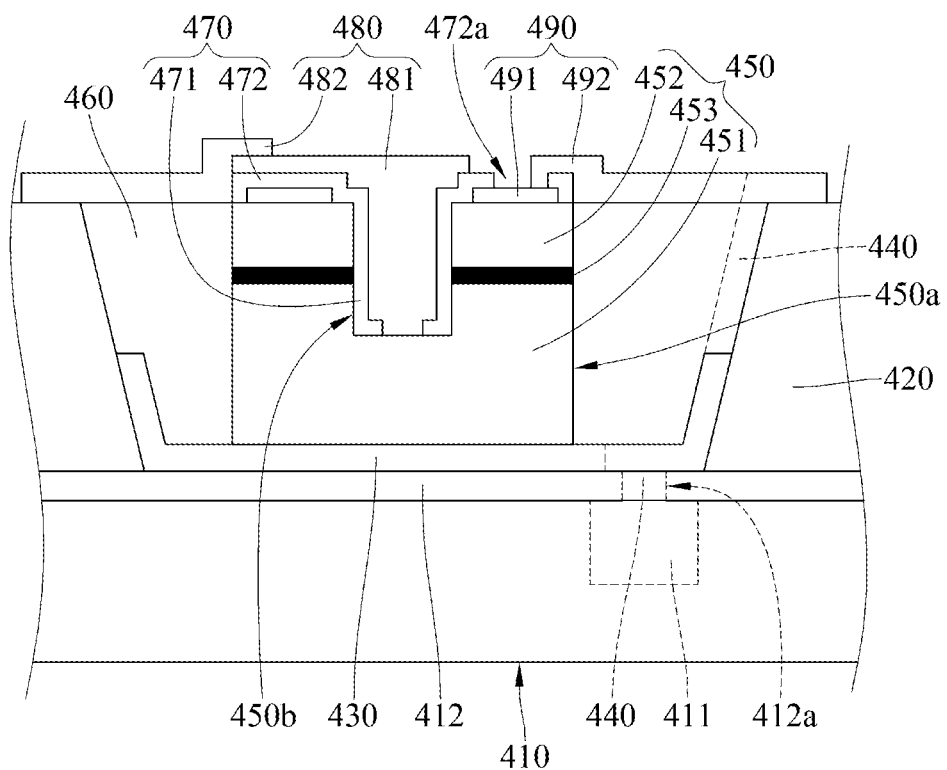

FIG. 7B is a schematic cross-sectional side-view drawing of an aspect of the light emitting device in FIG. 7A.

FIG. 8A, FIG. 8C, FIG. 8E, FIG. 8G, FIG. 8I, FIG. 8K, FIG. 8M, FIG. 8O, FIG. 8Q, and FIG. 8S are schematic top-view drawings showing a manufacturing process of another aspect of a light emitting device according to another embodiment.

FIG. 8B, FIG. 8D, FIG. 8F, FIG. 8H, FIG. 8J, FIG. 8L, FIG. 8N, FIG. 8P, FIG. 8R, and FIG. 8T are respective schematic cross-sectional side-view drawings of the light emitting device in FIG. 8A, FIG. 8C, FIG. 8E, FIG. 8G, FIG. 8I, FIG. 8K, FIG. 8M, FIG. 8O, FIG. 8Q, and FIG. 8S.

Figure 9:
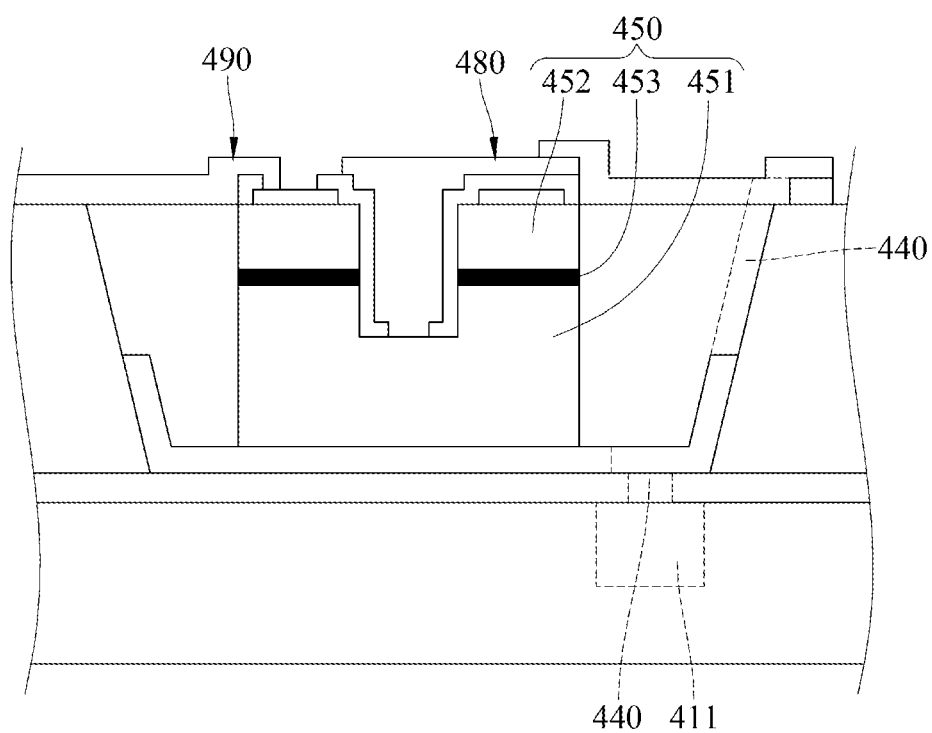

FIG. 9 is a schematic cross-sectional side-view drawing of a light emitting device according to another embodiment.

DETAILED DESCRIPTIONS

The following description describes in detail the characteristics and advantages of the present disclosure, with its content detailed enough to enable any person skilled in the relevant art to understand the technical content of the present disclosure and to implement accordingly; and according to the content, the claims, and the figures disclosed by the present specification, any person skilled in the relevant art can easily understand the purpose and advantages of the present disclosure. The following embodiments further illustrate the aspects of the present disclosure, but they do not limit the scope of the present disclosure.

Figure 1:
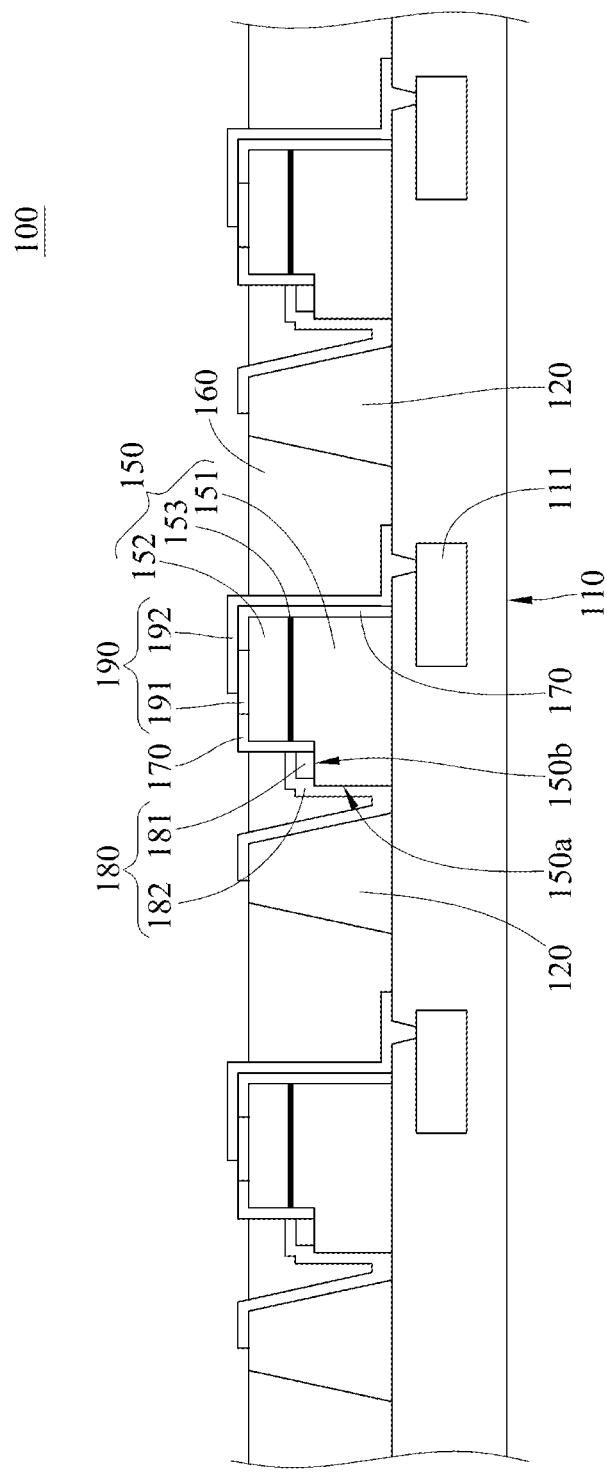
FIG. 1 is a schematic a cross-sectional side-view drawing of a light emitting device according to one embodiment.

FIG. 1 is a schematic cross-sectional side-view drawing of a light emitting device 100 according to one embodiment. The light emitting device 100 comprises a substrate 110, a partition wall 120, a light emitting chip 150, a transparent layer 160, an insulating layer 170, a first electrode 180, and a second electrode 190.

The substrate 110 comprises a plurality of driving elements 111. The driving element 111 may be or comprise a thin film transistor (TFT). A plurality of partition walls 120 disposed on the substrate 110 with each being adjacent to one another and surrounds at least one or more driving elements 111 respectively. A plurality of light emitting chips 150 may be disposed on the substrate 110 through an adhesion layer (not shown) and the plurality of partition walls 120 surrounds the plurality of light emitting chips 150 respectively. FIG. 1 shows that one driving element 111 and one light emitting chip 150 may be disposed inside one partition wall 120, but the present invention is not limited thereto. One driving element 111 and a plurality of light emitting chips 150 may also be disposed inside one partition wall 120. The plurality of light emitting chips 150 may emit light with the same color and may also emit light with different colors. The term "on" or "above" used to depict relationship elements is not intend to imply or suggest the two depicted the elements are in contact directly or indirectly.

The light emitting chip 150 comprises a first semiconductor layer 151 and a second semiconductor layer 152. The first semiconductor layer 151 is disposed on or above the substrate 110. The second semiconductor layer 152 is stacked on or above the first semiconductor layer 151 and forms a light emitting junction 153 with the first semiconductor layer 151. The first semiconductor layer 151 and the second semiconductor layer 152 may be made of different types of semiconductor materials. For example, the first semiconductor layer 151 may be an n-type semiconductor and the second semiconductor layer 152 may be a p-type semiconductor, or the first semiconductor layer 151 may be a p-type semiconductor and the second semiconductor layer 152 may be an n-type semiconductor. In addition, a semiconductor material is doped with different types of dopants, and a first semiconductor layer 151 and a second semiconductor layer 152 were formed from the semiconductor material; the light emitting chip 150 is then formed through cutting the doped semiconductor material. The light emitting chip 150 may have a notch 150b on a lateral 150a, to expose a part of the first semiconductor layer 151. That is the first semiconductor layer 151 may be not fully covered by the second semiconductor layer 152.

The insulating layer 170 partially covers the light emitting chip 150 to expose the part of the first semiconductor layer 151 located at the notch 150b and a part of the second semiconductor layer 152. It is noted that insulating layer 170 exposing the first semiconductor layer 151 means that there are at least some portion of the first semiconductor layer 151. The term "expose" in this document is not used to indicate anything should be exposed to outer space in an end product, i.e. covered by nothing, but used to depict the relationship of the layers. The insulating layer 170 may be formed by additionally applying a transparent insulating material. Alternatively, the insulating layer 170 may also be formed through a passivation process done on the semiconductor material of the light emitting chip 150. A material of the insulating layer 170 may be or may comprise silicon oxide ($SiO_2$), silicon nitride ($SiN_x$), zirconium oxide ($ZrO_x$), aluminum oxide ($Al_2O_3$), or a combination thereof.

The first electrode 180 comprises a first contact portion 181 and a first extension portion 182. The first contact portion 181 is disposed on the exposed part of the insulating layer 170, i.e., the first semiconductor layer 151, and is electrically connected to the first semiconductor layer 151. The first extension portion 182 is electrically connected to the first contact portion 181 and extends from the first contact portion 181 to the top of the partition wall 120 through the lateral 150a of the light emitting chip 150 and the substrate 110. The first contact portion 181 may be made of a transparent conductive material, and a material having good ohmic contact with the first semiconductor layer 151 may be selected. For example, the material of the first contact portion 181 may be a titanium aluminum titanium gold alloy (Ti/Al/Ti/Au), aluminum (Al), gold (Au), titanium (Ti), indium (In), tungsten (W), silver (Ag), an indium stannum alloy (InSn), titanium nitride (TiN), a neodymium aluminum alloy (Nd/Al), a palladium aluminum alloy (Pd/

Al), a tantalum aluminum alloy (Ta/Al), a titanium aluminum alloy (Ti/Al), a titanium gold alloy (Ti/Au), a gold germanium nickel alloy (Au/Ge/Ni), a chromium nickel gold alloy (Cr/Ni/Au), a titanium palladium gold alloy (Ti/Pd/Au), a titanium platinum gold alloy (Ti/Pt/Au), a titanium aluminum nickel gold alloy (Ti/Al/Ni/Au), or a combination thereof. The first extension portion 182 may be made of a highly conductive material. For example, the material of the first extension portion 182 may be silver, gold, copper (Cu), indium tin oxide (ITO), indium gallium zinc oxide (IGZO), a nickel gold alloy (Ni/Au), or a combination thereof. The first electrode 180 is electrically isolated from the second semiconductor layer 152 through the insulating layer 170.

The second electrode 190 comprises a second contact portion 191 and a second extension portion 192. The second contact portion 191 is disposed on the exposed part of the insulating layer 170, i.e., the second semiconductor layer 152, and is electrically connected to the second semiconductor layer 152. The second extension portion 192 is electrically connected to the second contact portion 191, extends from the second contact portion 191 to the substrate 110 through the insulating layer 170 covering the lateral 150a of the light emitting chip 150, and is electrically connected to the driving element 111 of the substrate 110. The second contact portion 191 may be made of a transparent conductive material, and a material having good ohmic contact with the second semiconductor layer 152 may be selected. The second extension portion 192 may be made of a highly conductive material. The second electrode 190 is electrically isolated from the first semiconductor layer 151 through the insulating layer 170.

The transparent layer 160 is disposed on the substrate 110, located between the light emitting chip 150 and the partition wall 120. FIG. 1 shows that the transparent layer 160 contacts a part of the insulating layer 170 located on the light emitting chip 150, a part of the first electrode 180 located on the light emitting chip 150, and a part of the second electrode 190 located on the light emitting chip 150, but the transparent layer 160 may also surround and contact an exposed part of the insulating layer 170, i.e., the lateral 150a of the light emitting chip 150. A part of the first electrode 180 is located between the lateral 150a of the light emitting chip 150 and the transparent layer 160, a part of the first electrode 180 is located between the substrate 110 and the transparent layer 160, and a part of the first electrode 180 is located between the partition wall 120 and the transparent layer 160. A part of the second electrode 190 is located between the insulating layer 170 and the transparent layer 160, and a part of the second electrode 180 is located between the substrate 110 and the transparent layer 160. In addition, the transparent layer 160 exhibits a refraction index between that of the light emitting chip 150 and that of a vacuum. The transparent layer 160 can guide the light emitted by the light emitting chip 150 from the lateral to the front of the light emitting chip 150 through such as reflection, refraction, and scattering, so as to increase and improve the front light output efficiency of the light emitting device.

For example, a material of the transparent layer 160 may be an epoxy resin or silicon. A material of the second semiconductor layer 152 is, for example, gallium nitride (GaN), having a refraction index of 2.5. The vacuum has a refraction index of 1 and the air has a refraction index close to 1. The epoxy resin has a refraction index of about 1.58. If the transparent layer 160 is not disposed, a total reflection critical angle, between gallium nitride and the air, is about 23.57°. Thus, of the light emitted from the light emitting junction 153 and passes through gallium nitride, the light having an incidence angle greater than 23.57° will be reflected back into the second semiconductor layer 152 completely. If the transparent layer 160 is disposed, the total reflection critical angle between gallium nitride and epoxy resin is about 42.84°, such that the light having an incidence angle between 23.57° and 42.84° can be away from the light emitting chip 150, thereby increasing the front light output efficiency of the light emitting device 100.

In the certain embodiment, the first electrode 180 may electrically connect to a common voltage source (Vss) and the first semiconductor layer 151, and the second electrode 190 may electrically connect to the driving element 111, for example, a drain of a transistor, and the second semiconductor layer 152. Through the control of the driving element 111, a bias voltage is applied on the first semiconductor layer 151 and the second semiconductor layer 152 such that the light emitting junction 153 emits light. Alternatively, the first semiconductor layer 151 and the second semiconductor layer 152 are provided with a current through the control of the driving element 111 such that the light emitting junction 153 emits light.

In the certain embodiment, the front light output efficiency is a ratio of the front light-receiving intensity to the total light-emitting intensity. The total light-emitting intensity represents the sum of the light intensity emitted in all directions from the light emitting chip 150, and the front light-receiving intensity represents the sum of the light intensity received from the front direction of the light emitting chip 150. In contrast to the certain embodiment, if the transparent layer 160 is not disposed, the front light output efficiency of the light emitting device is about 11.3%. The light emitting device 100 in the present embodiment has an increased front light output efficiency of about 20% through the provision of the transparent layer 160.

Figure 2:
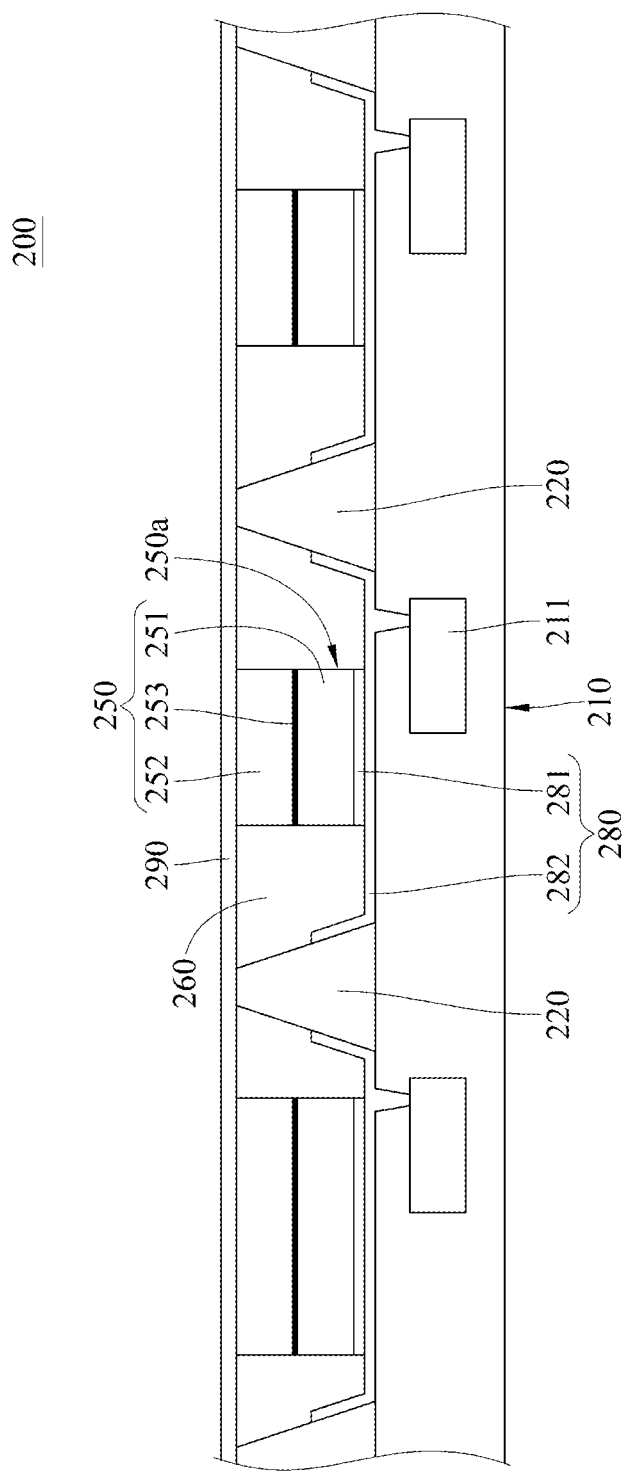
FIG. 2 is a schematic cross-sectional side-view drawing of a light emitting device according to another embodiment.

Please refer to FIG. 2, a schematic cross-sectional side-view drawing of a light emitting device 200 according to another embodiment. The light emitting device 200 comprises a substrate 210, a partition wall 220, a light emitting chip 250, a transparent layer 260, a first electrode 280, and a second electrode 290. Some elements in the present embodiment are similar to or the same as those of the light emitting device 100 in FIG. 1, and are represented by similar symbols; these elements, therefore, will not be described herein again.

The substrate 210 comprises a plurality of driving elements 211. A plurality of partition walls 220 adjacent to each other are disposed on the substrate 210 and surround a plurality of driving elements 211 respectively. The first electrode 280 comprises a first contact portion 281 and a first extension portion 282. The first extension portion 282 is disposed on the substrate 210 and is electrically connected to the driving element 211. The first contact portion 281 is disposed on the first extension portion 282 and the light emitting chip 250 is disposed on the substrate 210 through the first contact portion 281 and the first extension portion 282 of the first electrode 280. The plurality of partition walls 220 surround a plurality of light emitting chips 250 respectively. FIG. 2 shows that one driving element 211 and one light emitting chip 250 may be disposed inside one partition wall 220, but the present invention is not limited thereto. One driving element 211 and a plurality of light emitting chips 250 may also be disposed inside one partition wall 220. The first electrode 280 may be made of a highly conductive material.

The light emitting chip 250 comprises a first semiconductor layer 251 and a second semiconductor layer 252. The first semiconductor layer 251 is disposed on the first contact portion 281, being electrically connected to the first electrode 280, and is further electrically connected to the driving element 211. The second semiconductor layer 252 is stacked on the first semiconductor layer 251 and forms a light emitting junction 253 with the first semiconductor layer 251. The light emitting chip 250 in the present embodiment may not have a notch. A material of the first semiconductor layer 251 may be p-type gallium nitride (p-GaN), p-type gallium arsenide (p-GaAs), p-type indium phosphide (p-InP), or a combination thereof. A material of the second semiconductor layer 252 may be n-type gallium nitride (n-GaN), n-type gallium arsenide (n-GaAs), n-type indium phosphide (n-InP), or a combination thereof.

The transparent layer 260, disposed on the substrate 210, is located between the light emitting chip 250 and the partition wall 220, and contacts a lateral 250a of the light emitting chip 250. A part of the first electrode 280 is located between the partition wall 220 and the transparent layer 260, and a part of the first electrode 280 is located between the substrate 210 and the transparent layer 260. The transparent layer 260 has a refraction index between that of the light emitting chip 250 and that of a vacuum. The transparent layer 260 can guide the light emitted by the light emitting chip 250 from the lateral to the front of the light emitting chip 250 through reflection, refraction, and/or scattering, so as to increase and improve the front light output efficiency of the light emitting device 200.

The second electrode 290 is stacked on the second semiconductor layer 252 and the transparent layer 260 and extends onto the partition wall 220. The second electrode 290 is electrically connected to the second semiconductor layer 252. The transparent layer 260 separates the lateral 250a of the light emitting chip 250 from the second electrode 290.

In the present embodiment, the first electrode 280 may electrically connect to the driving element 211 and the first semiconductor layer 251, and the second electrode 290 may electrically connect to a common voltage source and the second semiconductor layer 252. Through the control of the driving element 211, a bias voltage is applied on the first semiconductor layer 251 and the second semiconductor layer 252 such that the light emitting junction 253 emits light. Alternatively, the first semiconductor layer 251 and the second semiconductor layer 252 are provided with a current through the control of the driving element 211 such that the light emitting junction 253 emits light.

In the present embodiment, the transparent layer 260 of the light emitting device 200 separates the second electrode 290 from the lateral 250a of the light emitting chip 250, to prevent the second electrode 290 from adhering to the lateral 250a so that the light emitted from the lateral 250a will not be blocked. The light emitting device 200 can further guide the light emitted by the light emitting chip 250 from the lateral to the front of the light emitting chip 250 through reflection, refraction, and/or scattering of the transparent layer 260, so as to increase and improve the front light output efficiency of the light emitting device 200. The front light output efficiency of the light emitting device 200 in the present embodiment can be, ideally, increased to about 20%.

Figure 3A:
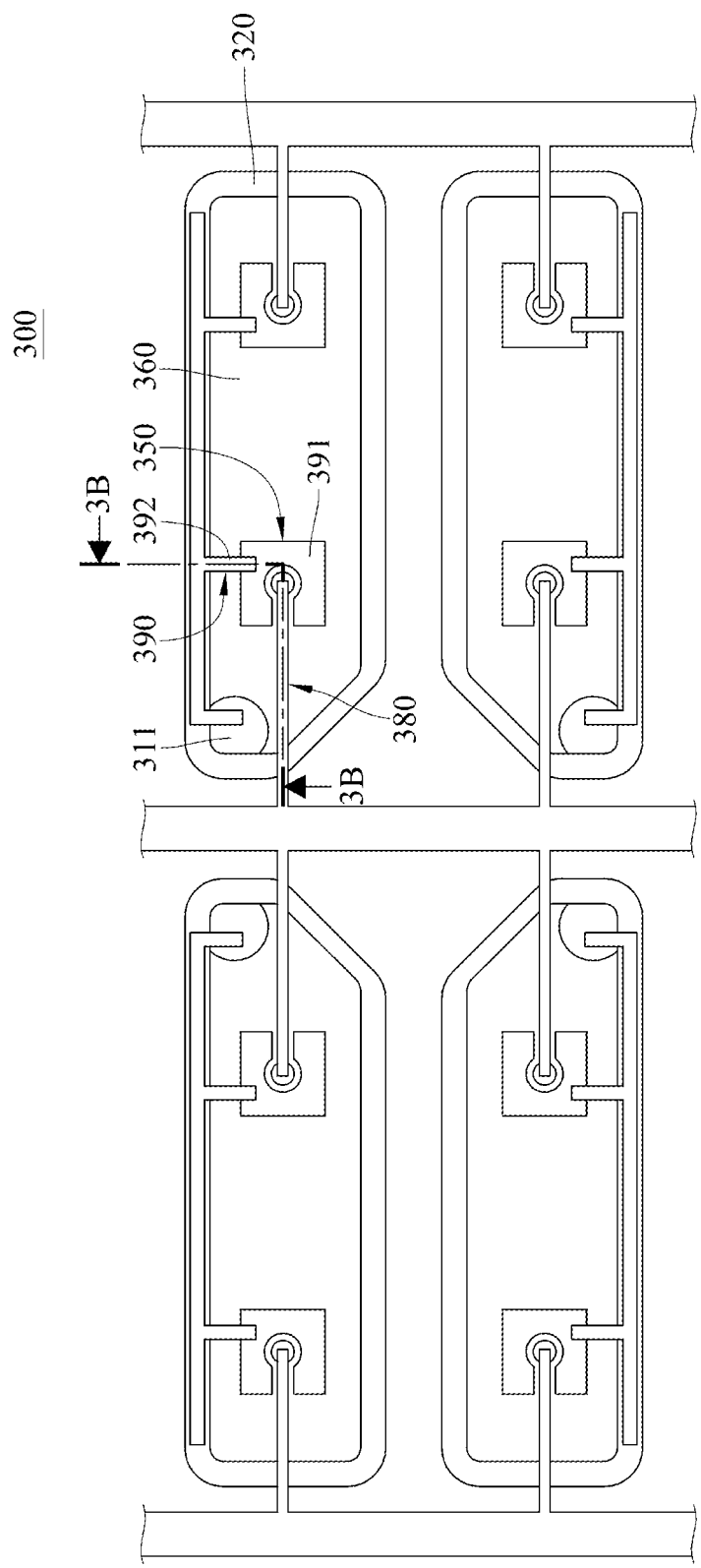
FIG. 3A is a schematic top-view drawing of an aspect of a light emitting device according to another embodiment.
Figure 3B:
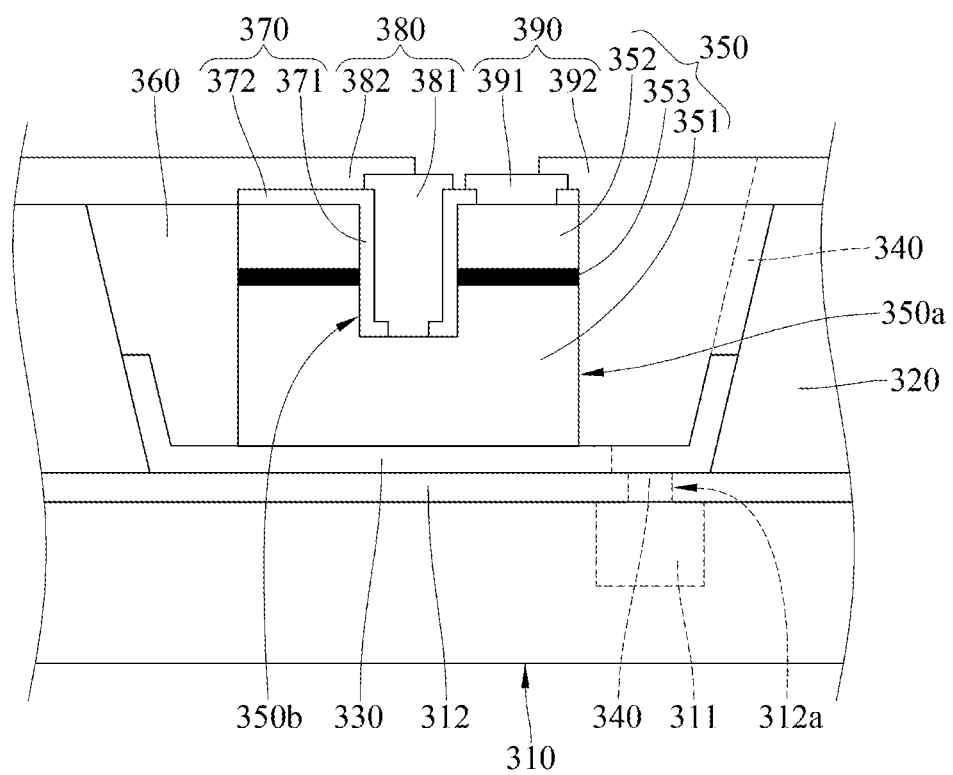
FIG. 3B is a schematic cross-sectional side-view drawing of an aspect of the light emitting device in FIG. 3A.

Please refer to FIG. 3A, a schematic top-view drawing of an aspect of a light emitting device 300 according to another embodiment; FIG. 3B is a schematic cross-sectional side-view drawing of an aspect of the light emitting device 300 in FIG. 3A. The light emitting device 300 comprises a substrate 310, an insulating layer 312, a partition wall 320, an adhesion layer 330, a driving electrode 340, a light emitting chip 350, a transparent layer 360, an insulating layer 370, a first electrode 380, and a second electrode 390. Some elements in the present embodiment are similar to or the same as those of the light emitting device 100 in FIG. 1, and are represented by similar symbols; these elements, therefore, will not be described herein again.

The substrate 310 comprises a plurality of driving elements 311. The insulating layer 312, disposed on the substrate 310, has a plurality of through-holes 312a, and a plurality of partition walls 320 are disposed on the insulating layer 312 and surround a plurality of driving elements 311 respectively. In FIG. 3A, one partition wall 320 surrounds one driving element 311. The adhesion layer 330 and the driving electrode 340 are disposed on the insulating layer 312, and one end of the driving electrode 340 passes through the insulating layer 312 through the through-hole 312a to be electrically connected to the driving element 311. The other end of the driving electrode 340 extends to the top of the partition wall 320. A plurality of light emitting chips 350 may be disposed on the insulating layer 312 through the adhesion layer 330 and the plurality of partition walls 320 surrounds the plurality of light emitting chips 350 respectively. FIG. 3A shows that two light emitting chips 350 may be disposed inside one partition wall 320, but the present invention is not limited thereto. One or more than two light emitting chips 350 may also be disposed inside one partition wall 320.

The light emitting chip 350 comprises a first semiconductor layer 351 and a second semiconductor layer 352. The first semiconductor layer 351 is disposed on the adhesion layer 330. The second semiconductor layer 352 is stacked on the first semiconductor layer 351 and forms a light emitting junction 353 with the first semiconductor layer 351. The light emitting chip 350 has an opening 350b. The opening 350b passes through the second semiconductor layer 352 and extends into the first semiconductor layer 351.

The transparent layer 360 is disposed on the substrate 310, located between the light emitting chip 350 and the partition wall 320. The transparent layer 360 may surround and contact a lateral 350a of the light emitting chip 350. The transparent layer 360 has a refraction index between that of the light emitting chip 350 and that of a vacuum. The transparent layer 360 can guide the light emitted by the light emitting chip 350 from the lateral to the front of the light emitting chip 350 through reflection, refraction, and/or scattering, so as to increase and improve the front light output efficiency of the light emitting device 300.

The insulating layer 370 comprises a first insulating layer 371 and a second insulating layer 372, and these two layers are connected to each other. The first insulating layer 371 is disposed on an inner wall of the opening 350b, and the second insulating layer 372 is disposed on the second semiconductor layer 352.

The first electrode 380 comprises a first contact portion 381 and a first extension portion 382. The first contact portion 381 is disposed inside the opening 350b and passes through the first insulating layer 371 to be electrically connected to the first semiconductor layer 351. The first contact portion 381 is electrically isolated from the second semiconductor layer 352 through the first insulating layer 371. The first extension portion 382 is stacked on the first contact portion 381 and the second insulating layer 372, and is electrically isolated from the second semiconductor layer 352 through the second insulating layer 372. The first extension portion 382 extends from the first contact portion 381, passes over an upper edge of the lateral 350a of the light emitting chip 350, the transparent layer 360, and onto the partition wall 320. The first extension portion 382 extends over the upper edge of the lateral 350a of the light emitting chip 350, suggesting that the first extension portion 382 can be suspended above the lateral 350a of the light emitting chip 350 and may not contact the lateral 350a of the light emitting chip 350 directly. The transparent layer 360 separates the lateral 350a of the light emitting chip 350 from the first electrode 380. The first electrode 380 is separated from the lateral 350a of the light emitting chip 350 and thus does not adhere or does not adhere completely to the lateral 350a.

The second electrode 390 comprises a second contact portion 391 and a second extension portion 392. The second contact portion 391 is disposed inside a through-hole 372a passing through the second insulating layer 372, and is substantially laid on the entire area, not covered by the second insulating layer 372, of the second semiconductor layer 352. A larger area of the second contact portion 391 laid on the second semiconductor layer 352 results in a greater decrease in the impedance between the second contact portion 391 and the second semiconductor layer 352, and a greater chance in avoiding the faulty electrical connection problems during subsequent electrical connections. The second contact portion 391 is away from the first extension portion 382 and the first contact portion 381. As such, the second contact portion 391 is stacked on and electrically connected to the second semiconductor layer 352, and is electrically isolated from the first electrode 380. The area of the first extension portion 382 located on the second semiconductor layer 352 is less than the area of the second contact portion 391 located on the second semiconductor layer 352. The second extension portion 392 is stacked on and electrically connected to the second contact portion 391. The second extension portion 392 extends from the second contact portion 391, passes over the upper edge of the lateral 350a of the light emitting chip 350, the transparent layer 360, and to the top of the partition wall 320; the extension portion 392 is electrically connected to the driving electrode 340, and is further electrically connected to the driving element 311. The second extension portion 392 extends over the upper edge of the lateral 350a of the light emitting chip 350, suggesting that the second extension portion 392 can be suspended above the lateral 350a of the light emitting chip 350 and may not contact the lateral 350a of the light emitting chip 350 directly. The transparent layer 360 separates the lateral 350a of the light emitting chip 350 from the second electrode 390. The second electrode 390 is separated from the lateral 350a of the light emitting chip 350 and thus does not adhere or completely adhere to the lateral 350a.

In addition, since the area of the second contact portion 391 located on the second semiconductor layer 352 is larger, the second extension portion 392, compared with the second contact portion 391, has a higher error-tolerant window, thereby reducing the faulty electrical connection problems.

In the present embodiment, the first electrode 380 may electrically connect to a common voltage source and the first semiconductor layer 351, and the second electrode 390 may electrically connect to the driving element 311 and the second semiconductor layer 351. Through the control of the driving element 311, a bias voltage is applied on the first semiconductor layer 351 and the second semiconductor layer 352 such that the light emitting junction 353 emits light. Alternatively, the first semiconductor layer 351 and the second semiconductor layer 352 are provided with a current through the control of the driving element 311 such that the light emitting junction 353 emits light.

In the present embodiment, the transparent layer 360 of the light emitting device 300 separates the first electrode 380 and the second electrode 390 from the lateral 350a of the light emitting chip 350, to prevent the first electrode 380 and the second electrode 390 from adhering to the lateral 350a so that the light emitted from the lateral 350a will not be blocked. The light emitting device 300 can further guide the light emitted by the light emitting chip 350 from the lateral to the front of the light emitting chip 350 through reflection, refraction, and scattering of the transparent layer 360, so as to increase and improve the front light output efficiency of the light emitting device 300. The front light output efficiency of the light emitting device 300 in the present embodiment can be ideally increased to about 36.2%.

Please refer to FIG. 4A to FIG. 4R, FIG. 4C, FIG. 4E, FIG. 4G, FIG. 4I, FIG. 4K, FIG. 4M, FIG. 4O, and FIG. 4Q, schematic top-view drawings showing a manufacturing process of another aspect of a light emitting device 300 according to another embodiment, and FIG. 4B, FIG. 4D, FIG. 4F, FIG. 4H, FIG. 4J, FIG. 4L, FIG. 4N, FIG. 4P, and FIG. 4R are schematic cross-sectional side-view drawings showing the manufacturing process. For the sake of simplification, in the aspect of the light emitting device 300 in FIG. 4A to FIG. 4R, one light emitting chip 350 and one driving element 311 are disposed inside one partition wall 320, but the present invention is not limited thereto; and the number of partition walls 320, light emitting chips 350, and driving elements 311 may be adjusted as needed. FIG. 4B, FIG. 4D, FIG. 4F, FIG. 4H, FIG. 4J, FIG. 4L, FIG. 4N, FIG. 4P, and FIG. 4R are schematic cross-sectional side-view drawings done based on the depicted cross-sectional lines in FIG. 4A, FIG. 4C, FIG. 4E, FIG. 4G, FIG. 4I, FIG. 4K, FIG. 4M, FIG. 4O, and FIG. 4Q respectively, wherein for the convenience of description, a part depicted by a dotted line such as the driving element 311 is shown although it does not pass through the cross-sectional line.

Figure 4A:
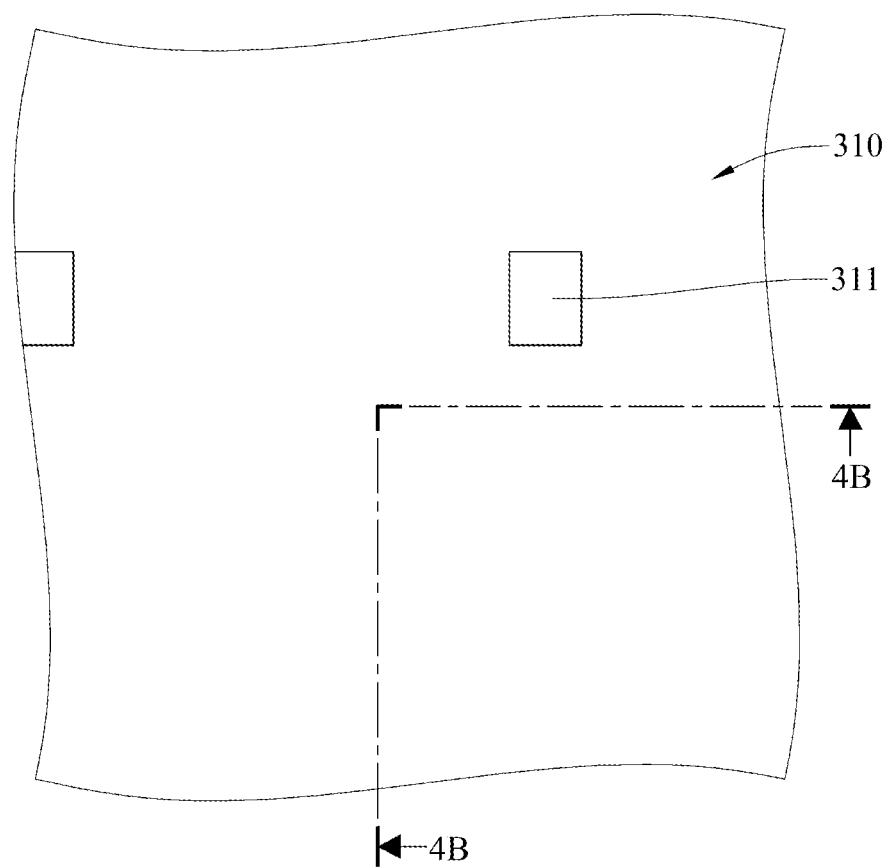
Figure 4B:
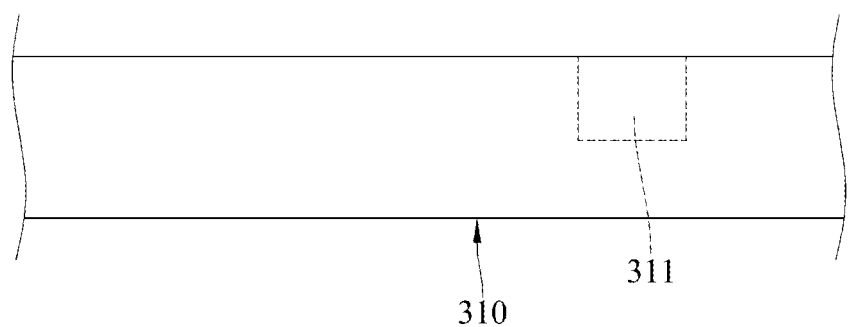

As shown in FIG. 4A and FIG. 4B, the substrate 310 comprising the driving element 311 is provided.

Figure 4C:
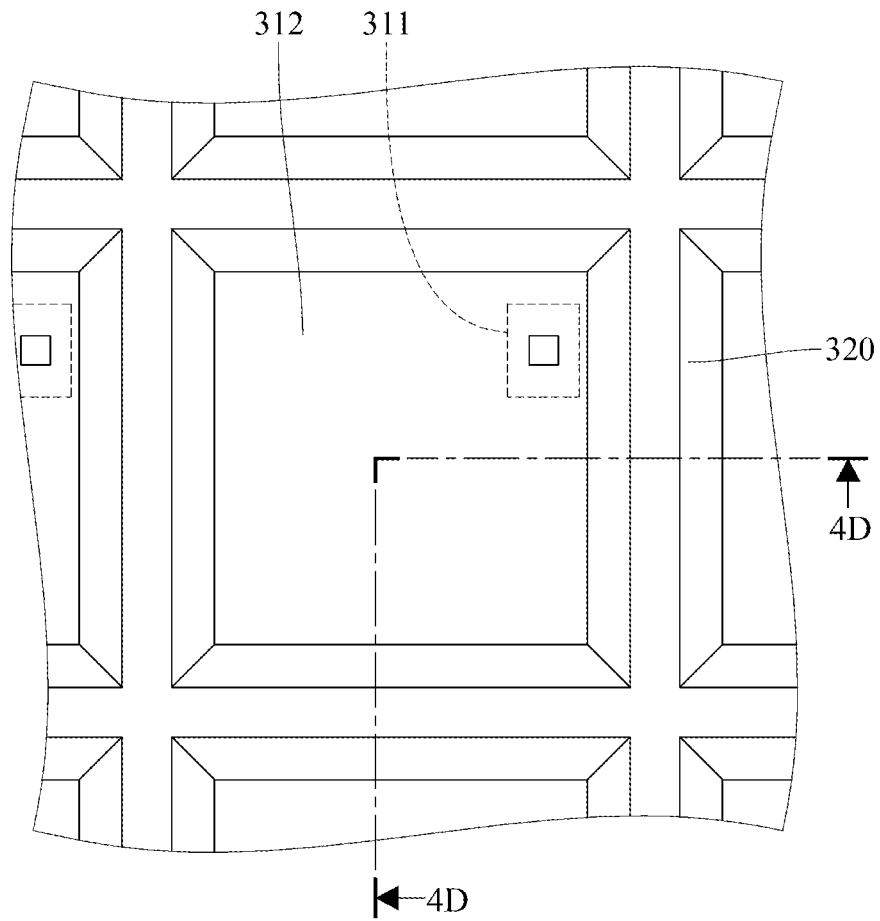
Figure 4D:
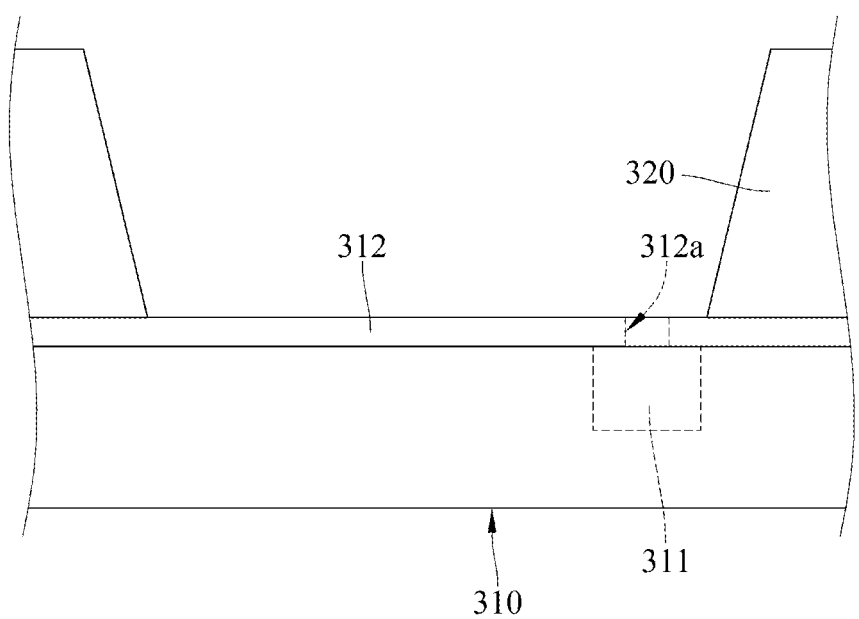

As shown in FIG. 4C and FIG. 4D, the insulating layer 312 is disposed on the substrate 310, wherein the plurality of through-holes 312a, corresponding to the driving elements 311, is formed in the insulating layer 312. The through-holes 312a may be formed through etching. The partition wall 320 is disposed on the insulating layer 312 and surrounds the driving element 311.

Figure 4E:
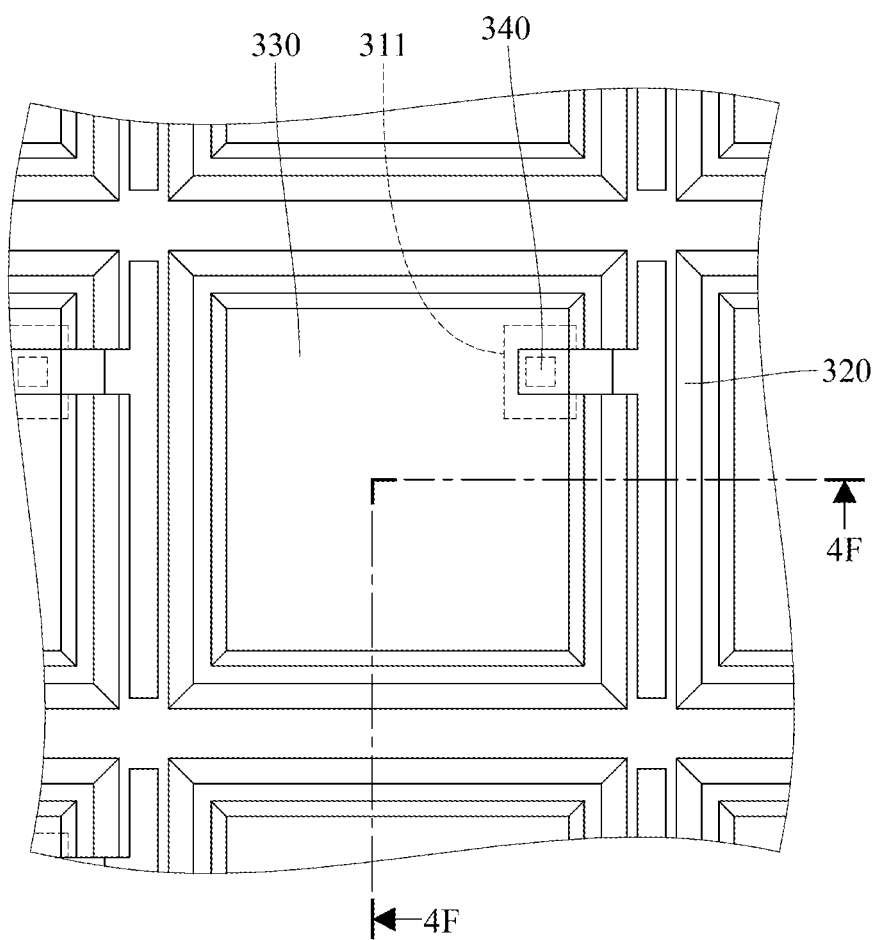
Figure 4F:
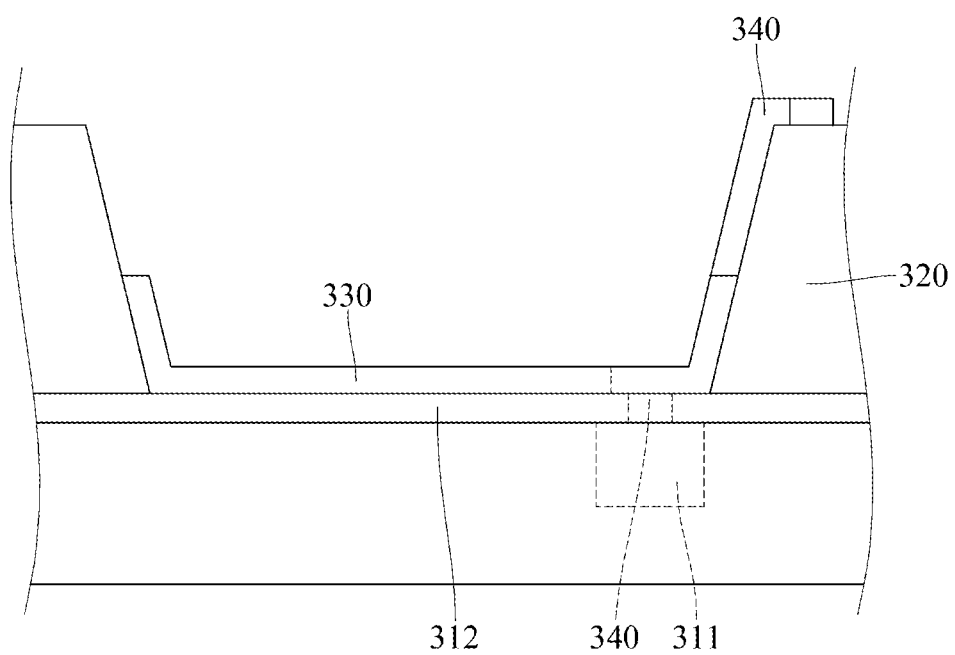

As shown in FIG. 4E and FIG. 4F, the adhesion layer 330 and the driving electrode 340 are disposed on the insulating layer 312. One end of the driving electrode 340 passes through the insulating layer 312 through the through-hole 312a to be electrically connected to the driving element 311. The other end of the driving electrode 340 extends to the top of the partition wall 320. The adhesion layer 330 is disposed on a part of the insulating layer 312 where the driving electrode 340 is not disposed. The adhesion layer 330 may extend to the partition wall 320.

Figure 4G:
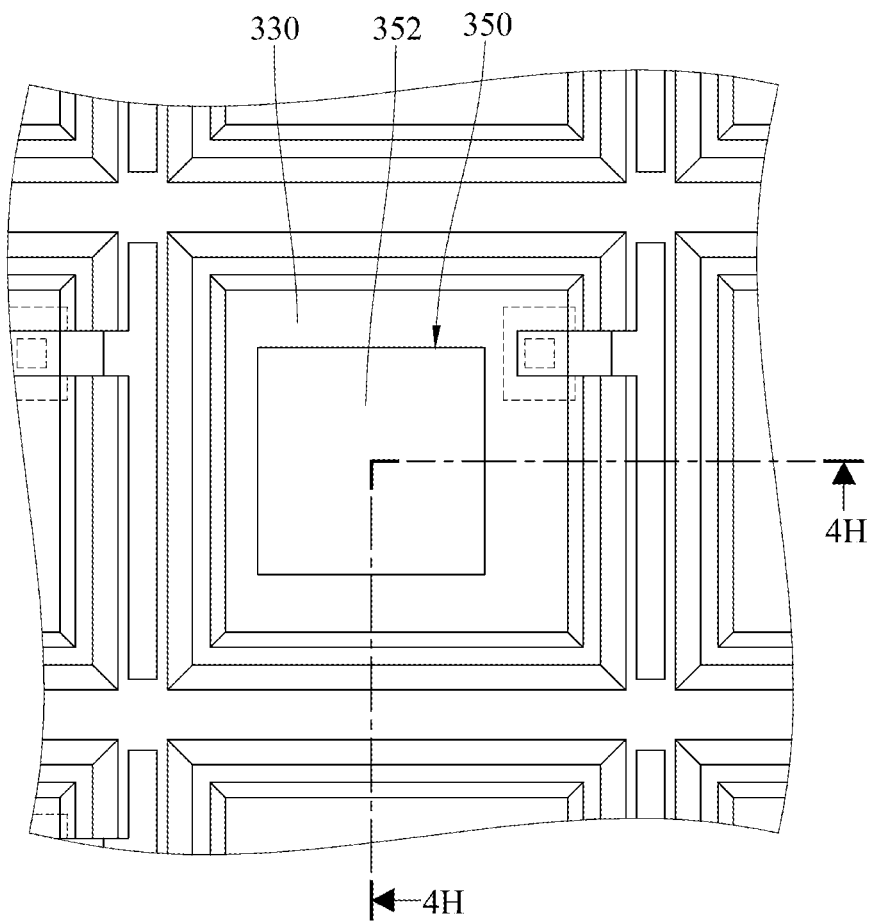
Figure 4H:
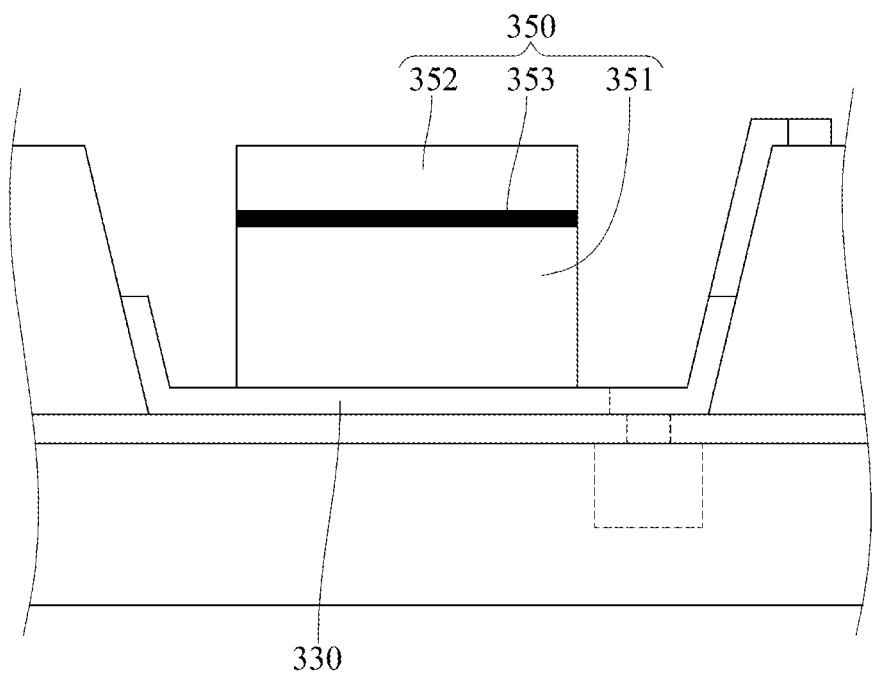

As shown in FIG. 4G and FIG. 4H, the light emitting chip 350 is disposed on the insulating layer 312 through the adhesion layer 330. The light emitting chip 350 comprises a first semiconductor layer 351 and a second semiconductor layer 352. The first semiconductor layer 351 is disposed on the adhesion layer 330. The second semiconductor layer 352 is stacked on the first semiconductor layer 351 and forms a light emitting junction 353 with the first semiconductor layer 351.

Figure 4I:
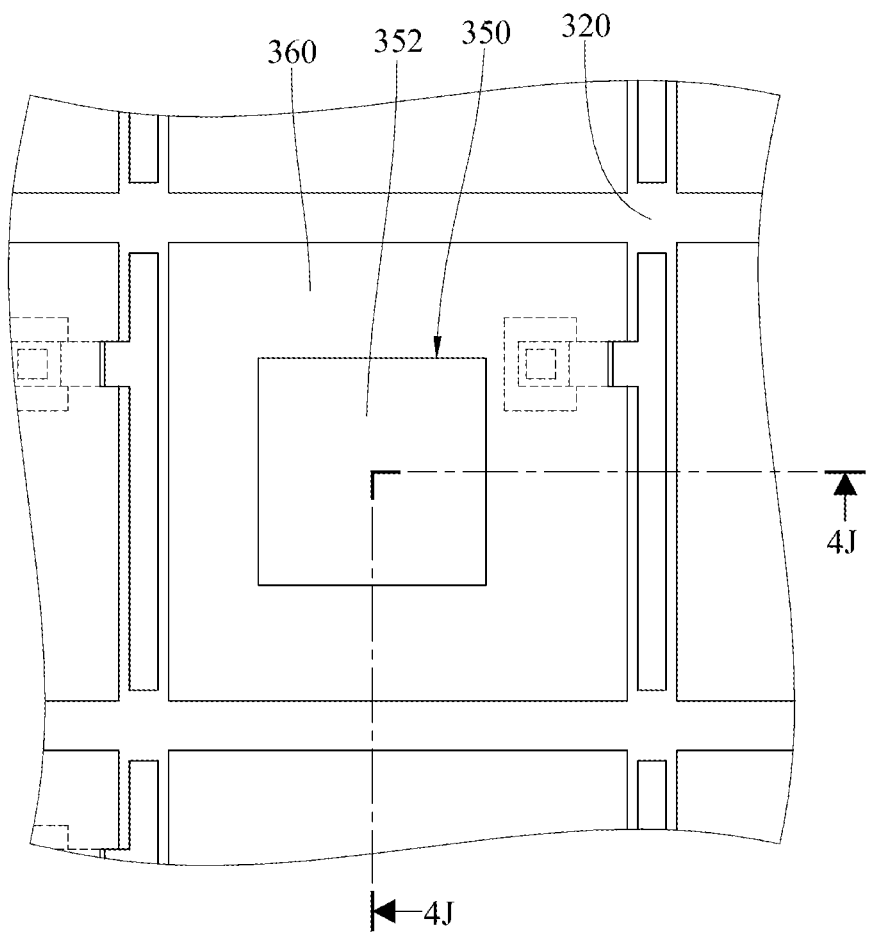
Figure 4J:
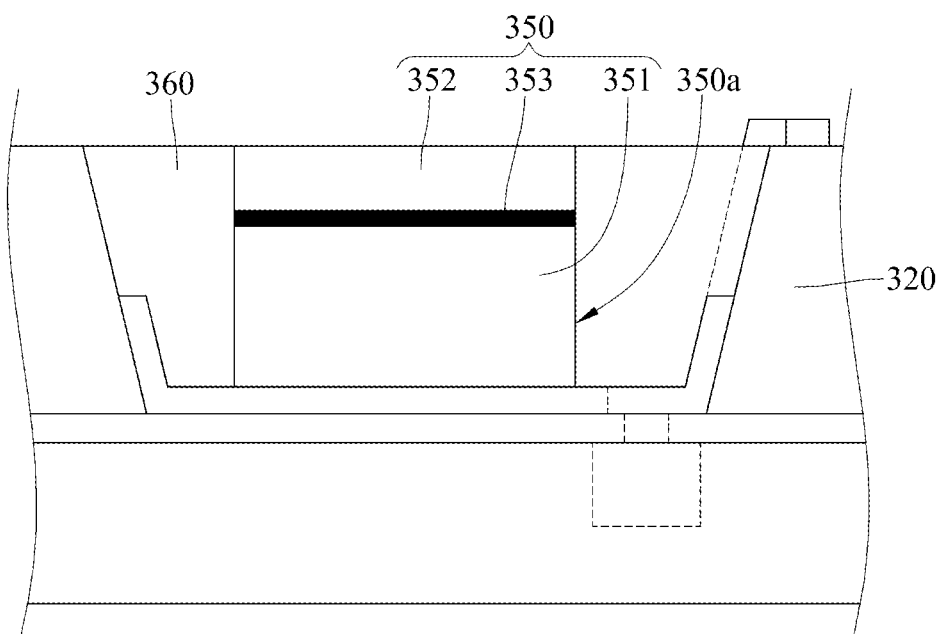

As shown in FIG. 4I and FIG. 4J, the transparent layer 360 is disposed on the substrate 310, located between the light emitting chip 350 and the partition wall 320. The transparent layer 360 may surround and contact a lateral 350a of the light emitting chip 350. The transparent layer 360 has a refraction index between that of the light emitting chip 350 and that of a vacuum.

Figure 4K:
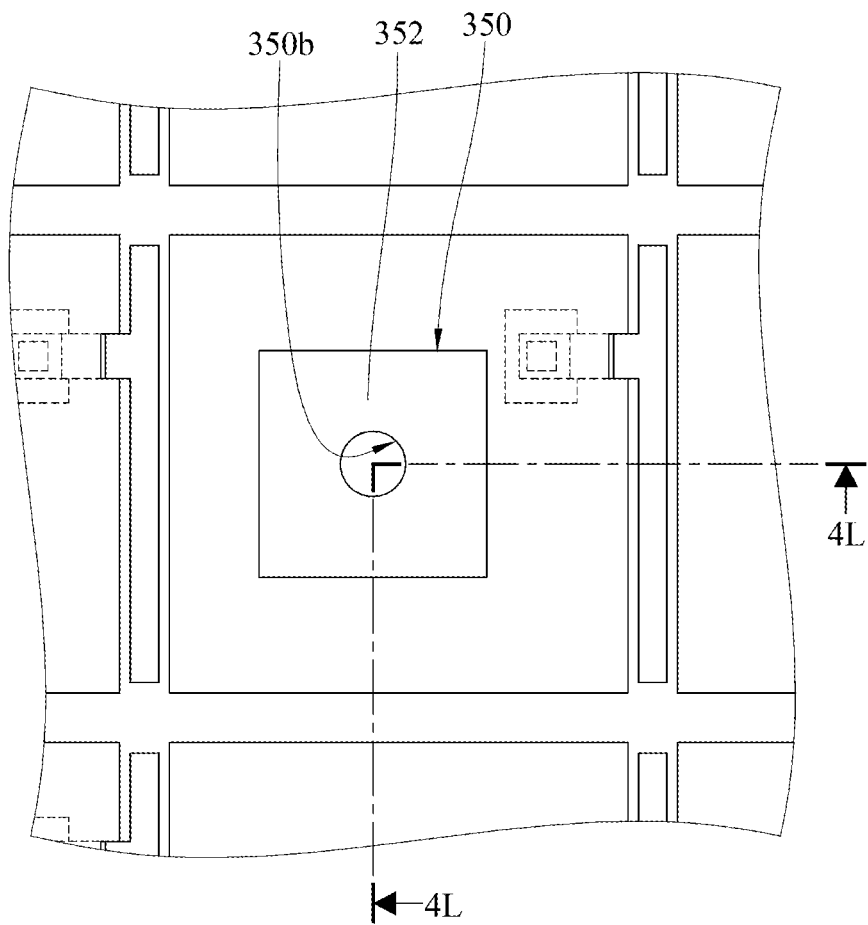
Figure 4L:
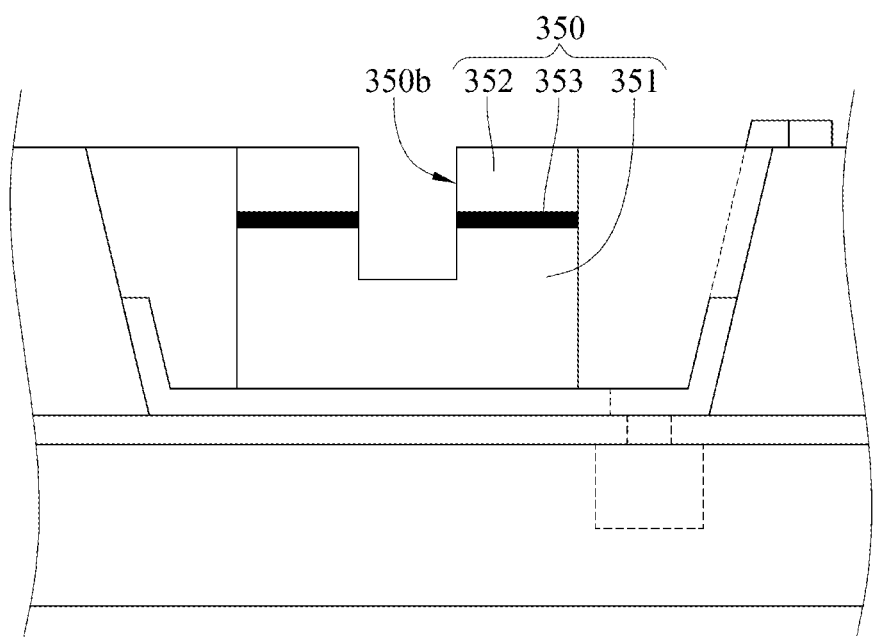

As shown in FIG. 4K and FIG. 4L, an opening 350b is formed downward near the center of the second semiconductor layer 352 of the light emitting chip 350. The opening 350b passes through the second semiconductor layer 352 and the light emitting junction 353 and extends into the first semiconductor layer 351. The opening 350b may be formed through etching.

Figure 4M:
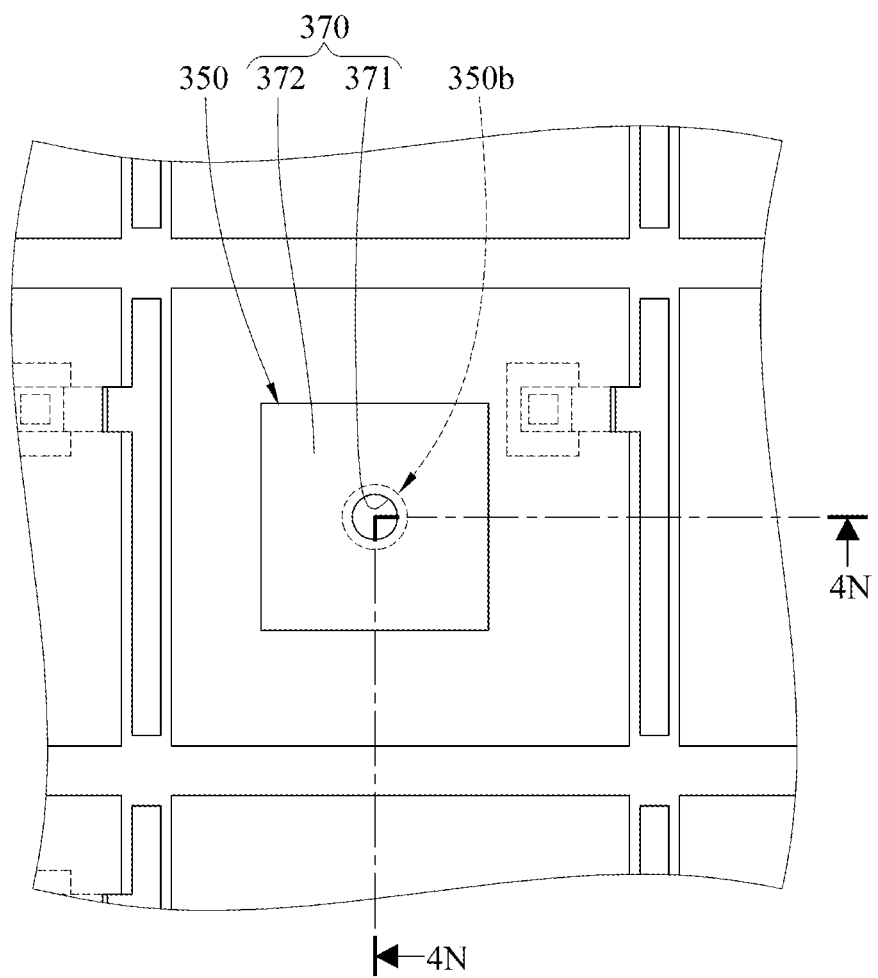
Figure 4N:
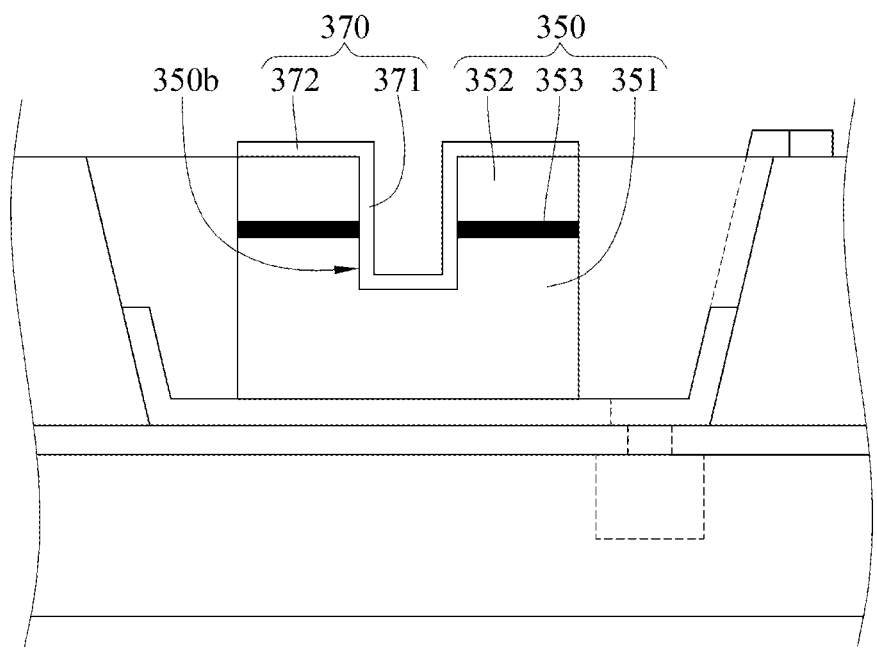

As shown in FIG. 4M and FIG. 4N, the insulating layer 370 is formed on the light emitting chip 350. The insulating layer 370 comprises a first insulating layer 371 and a second insulating layer 372, and these two layers are connected to each other. The first insulating layer 371 is disposed on an inner wall of the opening 350b, and the second insulating layer 372 is disposed on the second semiconductor layer 352. The second insulating layer 372 extends from the first insulating layer 371 to an upper edge of the lateral 350a of the light emitting chip 350. The first insulating layer 371 and the second insulating layer 372 may be formed in any order and may also be formed simultaneously. The insulating layer 370 may be formed through coating, deposition, or passivation.

Figure 4O:
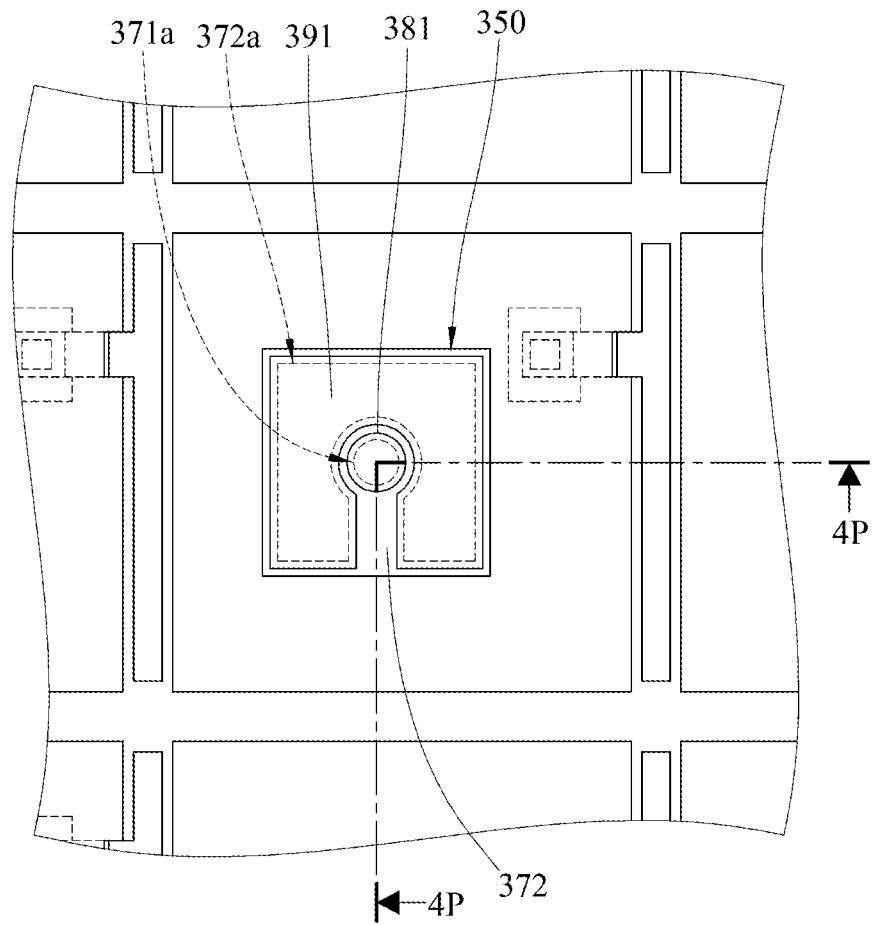
Figure 4P:
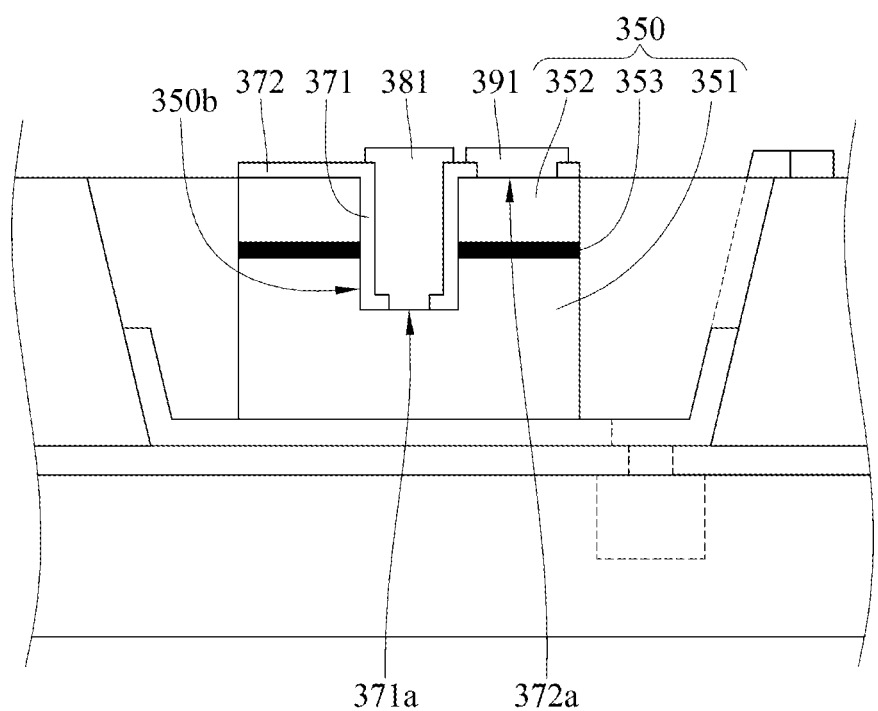

As shown in FIG. 4O and FIG. 4P, the first contact portion 381 is disposed in the opening 350b, and the second contact portion 391 is disposed in the through-hole 372a passing through the second insulating layer 372. The first contact portion 381 is electrically connected to the first semiconductor layer 351 through a through-hole 371a passing through the first insulating layer 371. The first contact portion 381 is electrically isolated from the second semiconductor layer 352 through the first insulating layer 371. The second contact portion 391 is substantially disposed on the entire area, not covered by the second insulating layer 372, of the second semiconductor layer 352 through the through-hole 372a passing through the second insulating layer 372, and the second contact portion 391 is electrically connected to the second semiconductor layer 352. A larger area of the second contact portion 391 laid on the second semiconductor layer 352 results in a greater decrease in the impedance between the second contact portion 391 and the second semiconductor layer 352, and a higher error-tolerant rate during subsequent electrical connections. The second contact portion 391 is away and electrically isolated from the first contact portion 381. The first contact portion 381 and the second contact portion 391 may be formed in any order and may also be formed simultaneously. The first contact portion 381 and the second contact portion 391 may be formed through sputtering, electroplating, or deposition.

Figure 4Q:
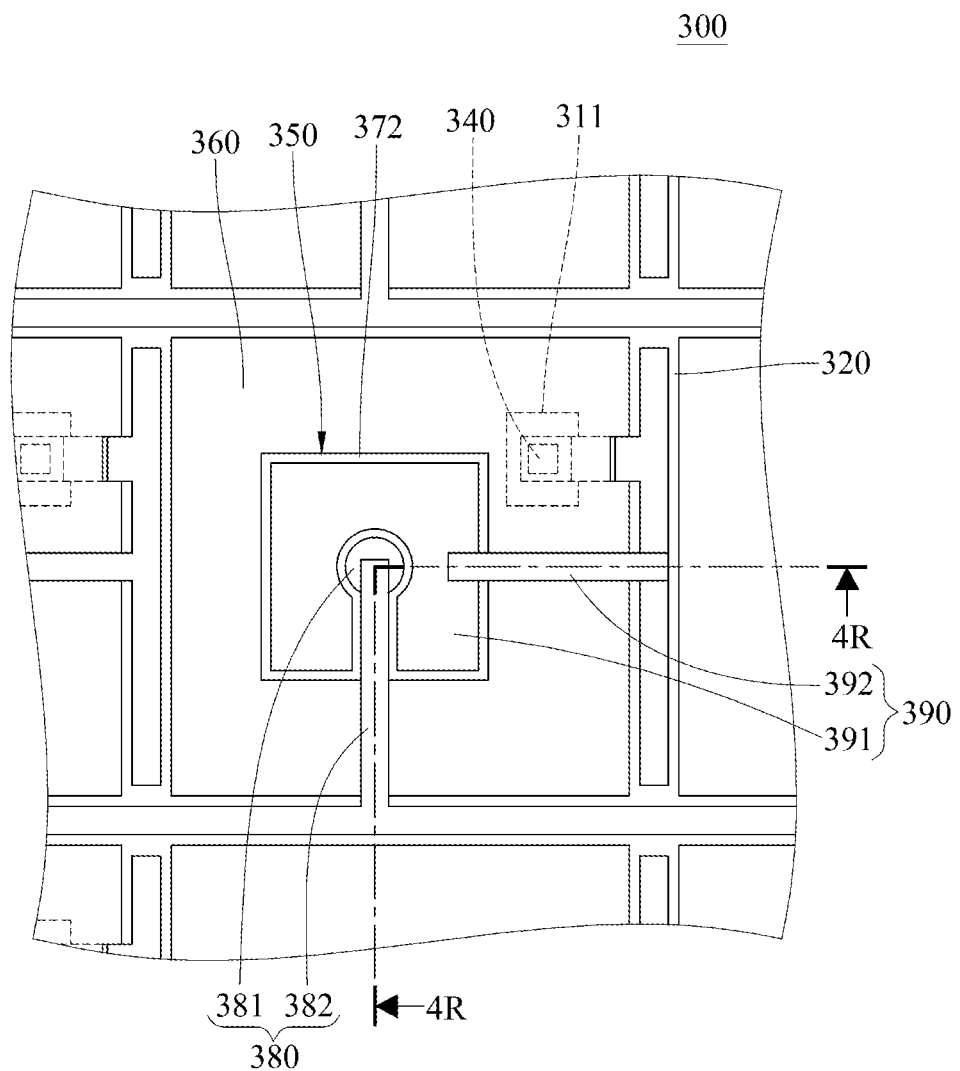
Figure 4R:
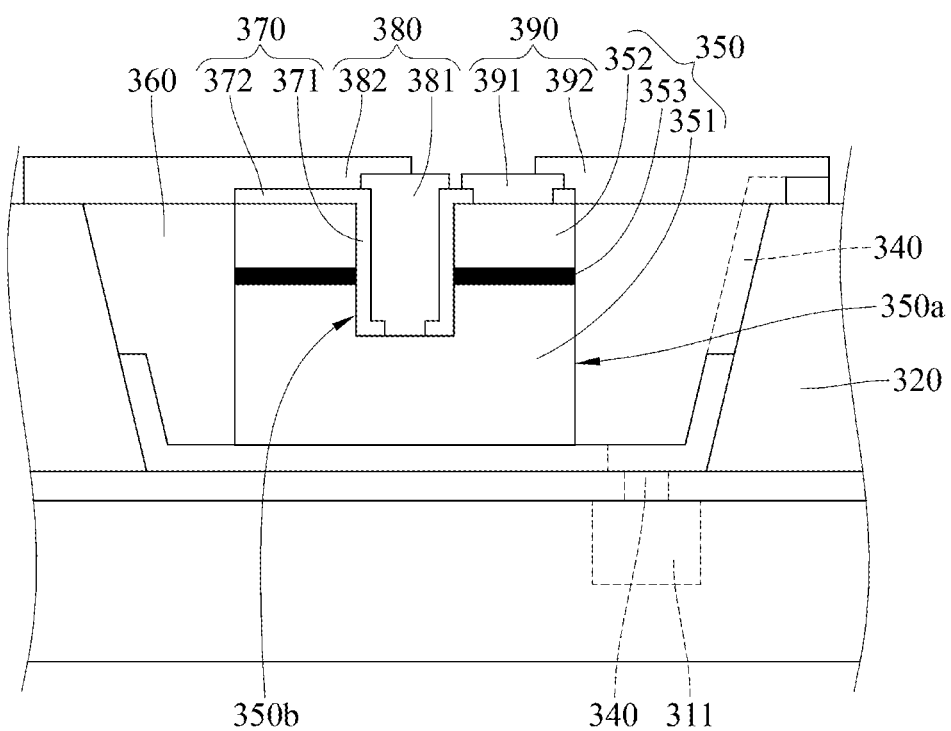

As shown in FIG. 4Q and FIG. 4R, the first extension portion 382 is formed on the first contact portion 381 and the second insulating layer 372, and the second extension portion 392 is formed on the second contact portion 391. The first extension portion 382 is electrically connected to the first contact portion 381, and the second insulating layer 372 electrically isolates the first extension portion 382 from the second semiconductor layer 352. The first extension portion 382 extends from the first contact portion 381, passes over an upper edge of the lateral 350a of the light emitting chip 350, the transparent layer 360, and onto the partition wall 320. The area of the first extension portion 382 located on the second semiconductor layer 352 is less than the area of the second contact portion 391 located on the second semiconductor layer 352. The first contact portion 381 and the first extension portion 382 form the first electrode 380. The second extension portion 392 is electrically connected to the second contact portion 391. The second extension portion 392 extends from the second contact portion 391, passes over the upper edge of the lateral 350a of the light emitting chip 350, the transparent layer 360, and to the top of the partition wall 320; and the extension portion 392 is electrically connected to the driving electrode 340, and is further electrically connected to the driving element 311. The second contact portion 391 and the second extension portion 392 form the second electrode 390. The first extension portion 382 and the second extension portion 392 may be formed through sputtering, electroplating, or deposition.

Please refer to FIG. 5, a schematic cross-sectional side-view drawing of a light emitting device 301 according to another embodiment. The light emitting device 301 is similar to the light emitting device 300 in FIG. 3B. The difference includes that, in the light emitting device 301, the first electrode 380 electrically connects the first semiconductor layer 351 of the light emitting chip 350 with the driving electrode 340, and thus electrically connects the first semiconductor layer 351 with the driving element 311. The second electrode 390 electrically connects to the second semiconductor layer 352 of the light emitting chip 350 and a common voltage source. Thus, the electrical connection from the light emitting chip 350 to the driving element 411 or the common voltage source may be adjusted as needed.

Please refer to FIG. 6, a schematic top-view drawing of a light emitting device 302 according to another embodiment. The light emitting device 302 is similar to the light emitting device 300 in FIG. 3A. The difference includes that, in the light emitting device 302, the area of the second contact portion 391 located on the light emitting chip 350 is greater than the area of the first extension portion 382 locating on the light emitting chip 350; therefore, the second electrode 390 may comprise a plurality of second extension portions 392 being electrically connected to the second contact portion 391.

Please refer to FIG. 7A, a schematic top-view drawing of an aspect of a light emitting device 400 according to another embodiment; FIG. 7B is a schematic cross-sectional side-view drawing of an aspect of the light emitting device 400 in FIG. 7A. The light emitting device 400 comprises a substrate 410, an insulating layer 412, a partition wall 420, an adhesion layer 430, a driving electrode 440, a light emitting chip 450, a transparent layer 460, an insulating layer 470, a first electrode 480, and a second electrode 490. Some elements in the present embodiment are similar to or the same as those of the light emitting device 100 in FIG. 1, and are represented by similar symbols; these elements, therefore, will not be described herein again.

The substrate 410 comprises a plurality of driving elements 411. The insulating layer 412, disposed on the substrate 410, has a plurality of through-holes 412a, and a plurality of partition walls 420 are disposed on the insulating layer 412 and surround a plurality of driving elements 411 respectively. In FIG. 7A, one partition wall 420 surrounds one driving element 411. The adhesion layer 430 and the driving electrode 440 are disposed on the insulating layer 412, and one end of the driving electrode 440 passes through the insulating layer 412 through the through-hole 412a to be electrically connected to the driving element 411. The other end of the driving electrode 440 extends to the top of the partition wall 420. A plurality of light emitting chips 450 may be disposed on the insulating layer 412 through the adhesion layer 430, and the plurality of partition walls 420 surrounds the plurality of light emitting chips 450 respectively. FIG. 7A shows that two light emitting chips 450 may be disposed inside one partition wall 420, but the present invention is not limited thereto. One or more than two light emitting chips 450 may also be disposed inside one partition wall 420.

The light emitting chip 450 comprises a first semiconductor layer 451 and a second semiconductor layer 452. The first semiconductor layer 451 is disposed on the adhesion layer 430. The second semiconductor layer 352 is stacked on the first semiconductor layer 351 and forms a light emitting junction 353 with the first semiconductor layer 351. The light emitting chip 450 has an opening 450b. The opening 450b passes through the second semiconductor layer 452 and extends into the first semiconductor layer 451.

The transparent layer 460 is disposed on the substrate 410, located between the light emitting chip 450 and the partition wall 420. The transparent layer 460 may surround and contact a lateral 450a of the light emitting chip 450. The transparent layer 460 has a refraction index between that of the light emitting chip 450 and that of a vacuum. The transparent layer 460 can guide the light emitted by the light emitting chip 450 from the lateral to the front of the light emitting chip 450 through reflection, refraction, and/or scattering, so as to increase and improve the front light output efficiency of the light emitting device 400.

The second electrode 490 comprises a second contact portion 491 and a second extension portion 492. The second contact portion 491 is laid on the substantial area of the second semiconductor layer 452's entire surface and is electrically connected to the second semiconductor layer 452. A larger area of the second contact portion 491 laid on the second semiconductor layer 452 results in a greater decrease in the impedance between the second contact portion 491 and the second semiconductor layer 452. The second contact portion 491 is away from the opening 450b. The insulating layer 470 comprises a first insulating layer 471 and a second insulating layer 472, and these two layers are connected to each other. The first insulating layer 471 is disposed on an inner wall of the opening 450b. The second insulating layer 472 is laid on the second contact portion 491.

The first electrode 480 comprises a first contact portion 481 and a first extension portion 482. One part of the first contact portion 481 is disposed inside the opening 450b, and the other part of the first contact portion 481 is disposed on a part of the second insulating layer 472. The first contact portion 481 is disposed on about half area of the second insulating layer 472. The first contact portion 481 passes through the first insulating layer 471 to be electrically connected to the first semiconductor layer 451. The first contact portion 481 is electrically isolated from the second semiconductor layer 452 through the first insulating layer 471 and is also electrically isolated from the second contact portion 491 through the second insulating layer 472. A through-hole 472a is provided on the other half area of the second insulating layer 472 so that the second contact portion 491 is exposed. The area size of the first contact portion 481 located on the second semiconductor layer 452 is close to the area size of the exposed second contact portion 491 on the through-hole 472a.

The first extension portion 482 is stacked on and electrically connected to the first contact portion 481. The first extension portion 382 extends from the first contact portion 381, passes over an upper edge of the lateral 350a of the light emitting chip 450, the transparent layer 460, and onto the partition wall 420. The first extension portion 482 extends over the upper edge of the lateral 450a of the light emitting chip 450, suggesting that the first extension portion 482 can be suspended above the lateral 450a of the light emitting chip 450 and may not contact the lateral 450a of the light emitting chip 450 directly. The transparent layer 460 separates the lateral 450a of the light emitting chip 450 from the first electrode 480. The first electrode 480 is separated from the lateral 450a of the light emitting chip 450 and thus does not adhere either partially or completely to the lateral 450a. The exposed area of the first contact portion 481 is large enough so that a plurality of first extension portions 482 can be electrically connected to the first contact portion 481.

The second extension portion 492 is stacked on and electrically connected to the second contact portion 491. The second extension portion 492 extends from the second contact portion 491, passes over the upper edge of the lateral 450a of the light emitting chip 450, the transparent layer 460, and to the top of the partition wall 420; and the extension portion 492 is electrically connected to the driving electrode 440, and is further electrically connected to the driving element 411. The second extension portion 492 extends over the upper edge of the lateral 450a of the light emitting chip 450, suggesting that the second extension portion 492 can be suspended above the lateral 450a of the light emitting chip 450 and may not contact the lateral 450a of the light emitting chip 450 directly. The transparent layer 460 separates the lateral 450a of the light emitting chip 450 from the second electrode 490. The second electrode 490 is separated from the lateral 450a of the light emitting chip 450 and thus does not adhere either partially or completely to the lateral 450a. The exposed area of the second contact portion 491 is large enough so that a plurality of second extension portions 492 can be electrically connected to the second contact portion 491.

In addition, since both the exposed areas of the first contact portion 481 and the second contact portion 491 are large enough, the first extension portion 482, compared with the first contact portion 481, has a higher error-tolerant rate, and the second extension portion 492, compared with the second contact portion 491, also has a higher error-tolerant rate, thereby reducing the faulty electrical connection problems.

In the present embodiment, the first electrode 480 may electrically connect a common voltage source with the first semiconductor layer 451, and the second electrode 490 may electrically connect the driving element 411 with the second semiconductor layer 451. Through the control of the driving element 411, a bias voltage is applied on the first semiconductor layer 451 and the second semiconductor layer 452 such that the light emitting junction 453 emits light. Alternatively, the first semiconductor layer 451 and the second semiconductor layer 452 are provided with a current through the control of the driving element 411 such that the light emitting junction 453 emits light.

In the present embodiment, the transparent layer 460 of the light emitting device 400 separates the first electrode 480 and the second electrode 490 from the lateral 450a of the light emitting chip 450, to prevent the first electrode 480 and the second electrode 490 from adhering to the lateral 450a so that the light emitted from the lateral 450a will not be blocked. The light emitting device 400 can further guide the light emitted by the light emitting chip 450 from the lateral to the front of the light emitting chip 450 through reflection, refraction, and/or scattering of the transparent layer 460, so as to increase and improve the front light output efficiency of the light emitting device 400. The front light output efficiency of the light emitting device 400 in the present embodiment can be ideally increased to about 36.2%.

Figure 8A:
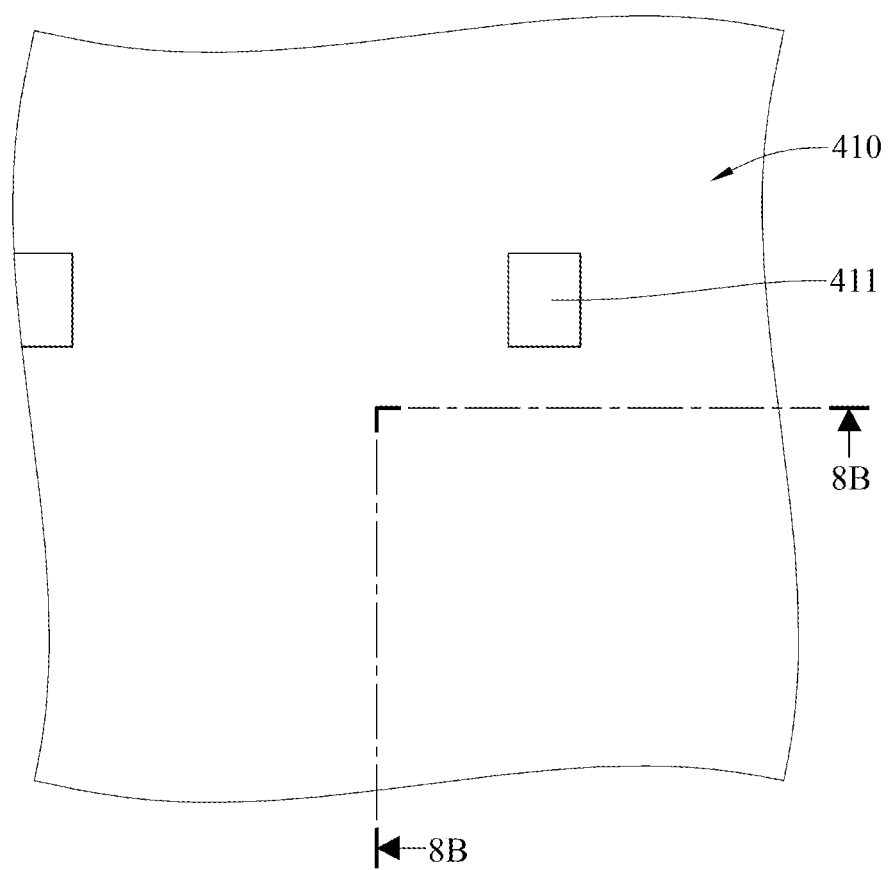
Figure 8B:
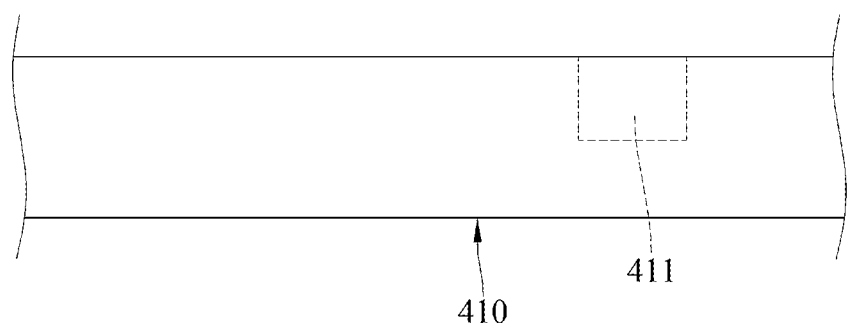
Figure 8C:
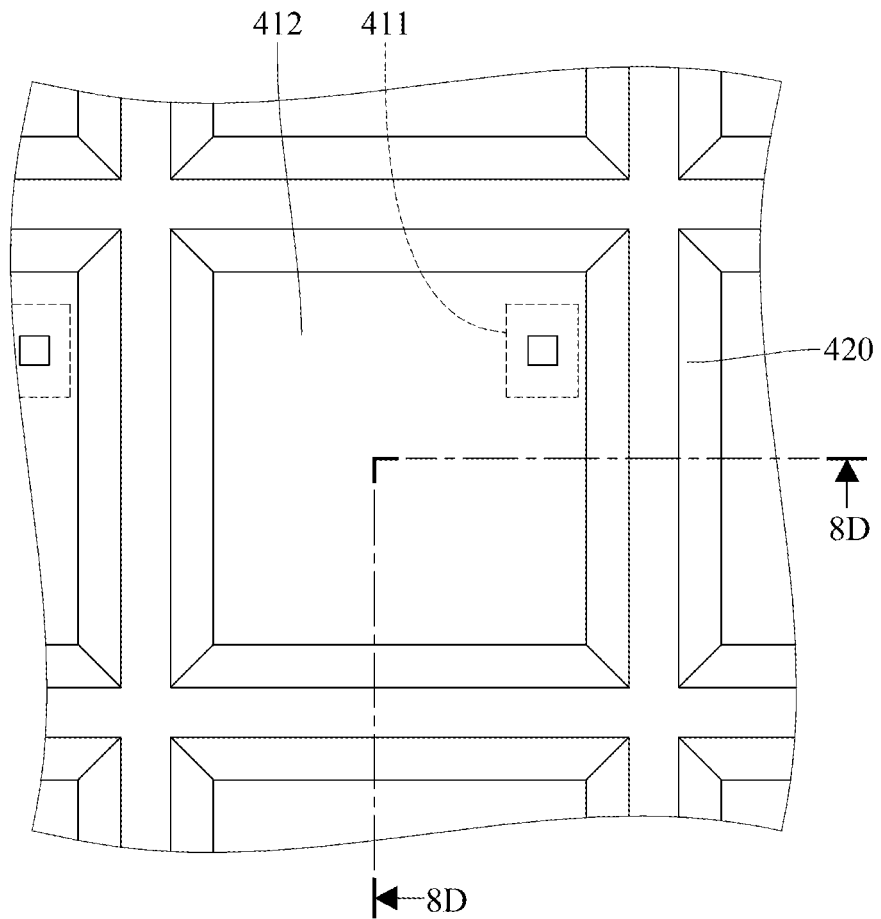
Figure 8D:
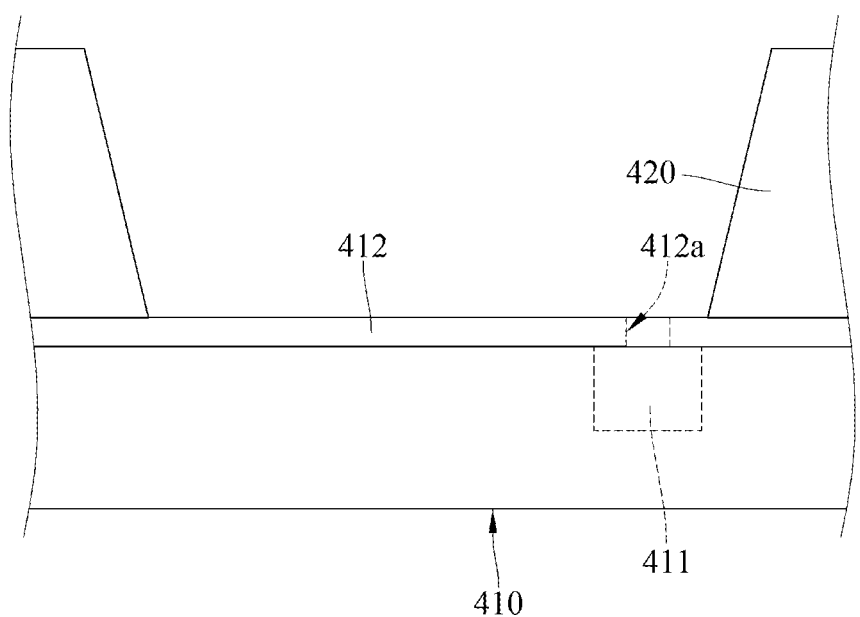
Figure 8E:
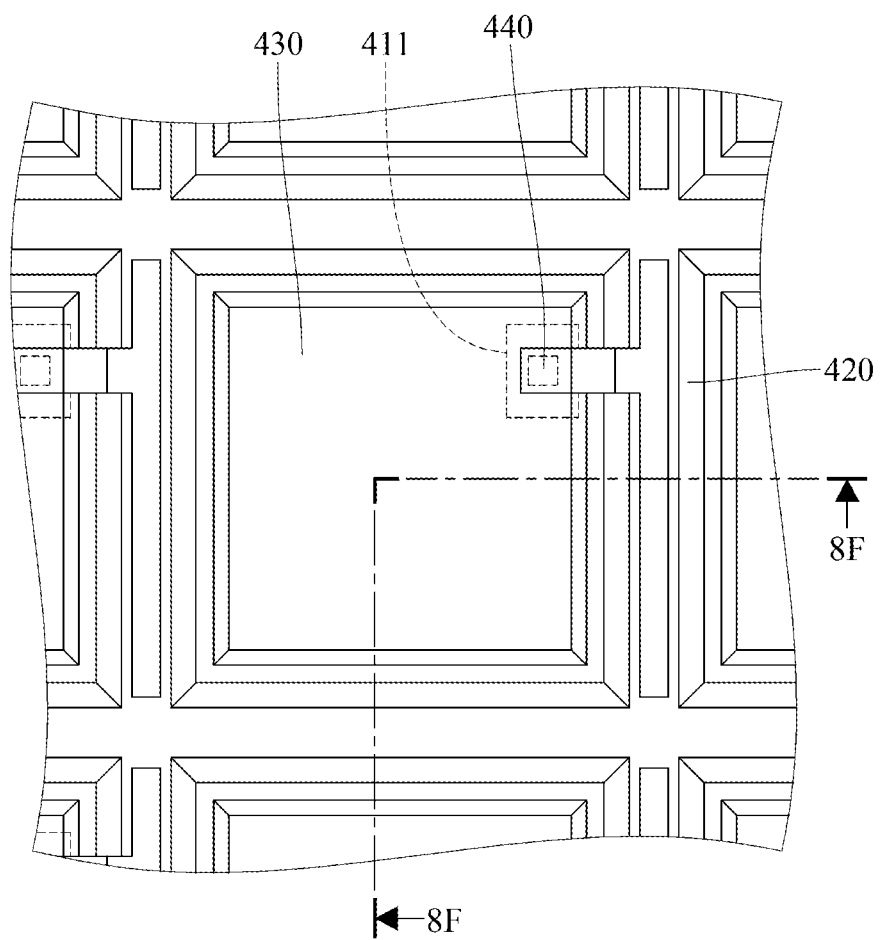
Figure 8F:
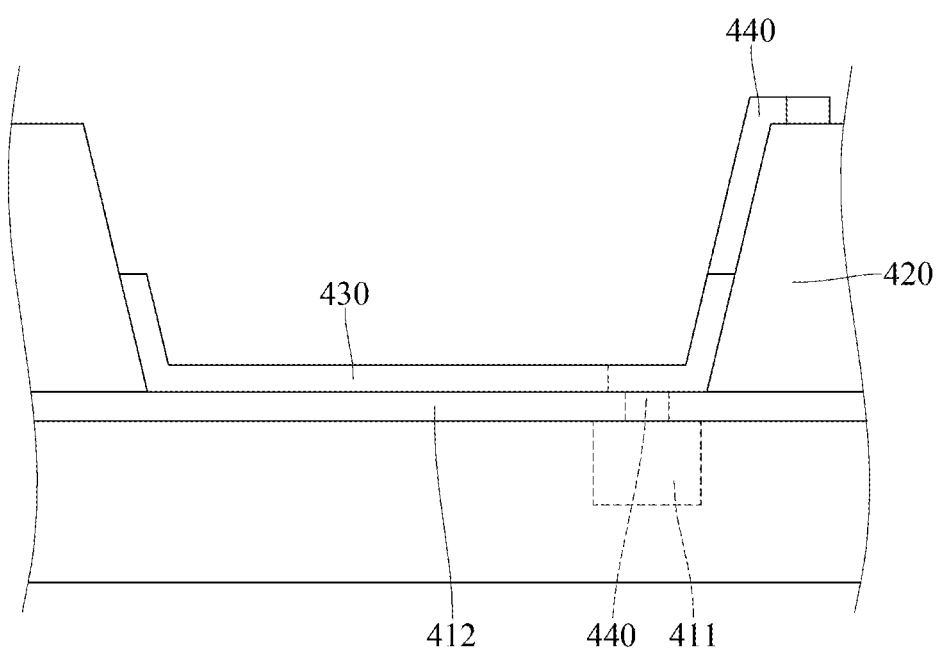
Figure 8G:
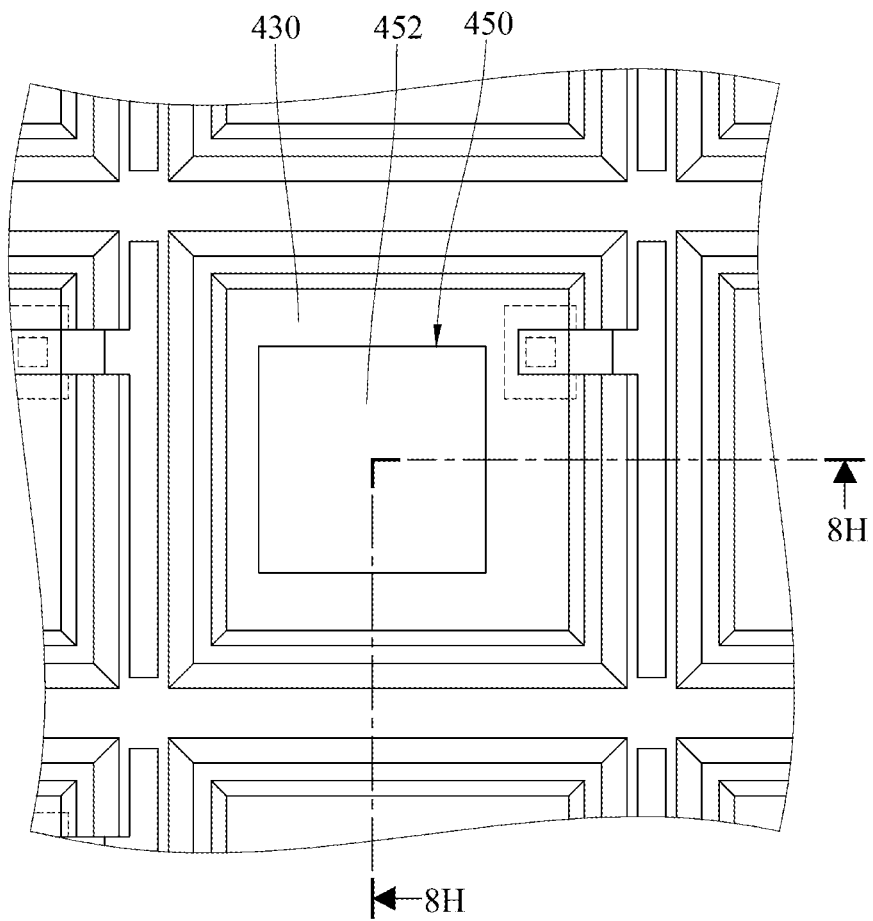
Figure 8H:
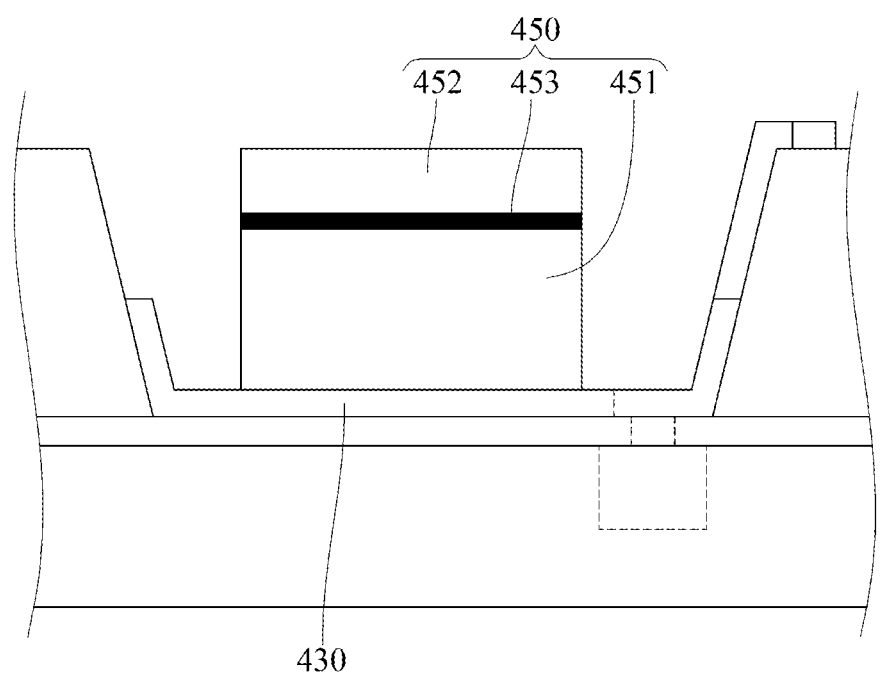
Figure 8I:
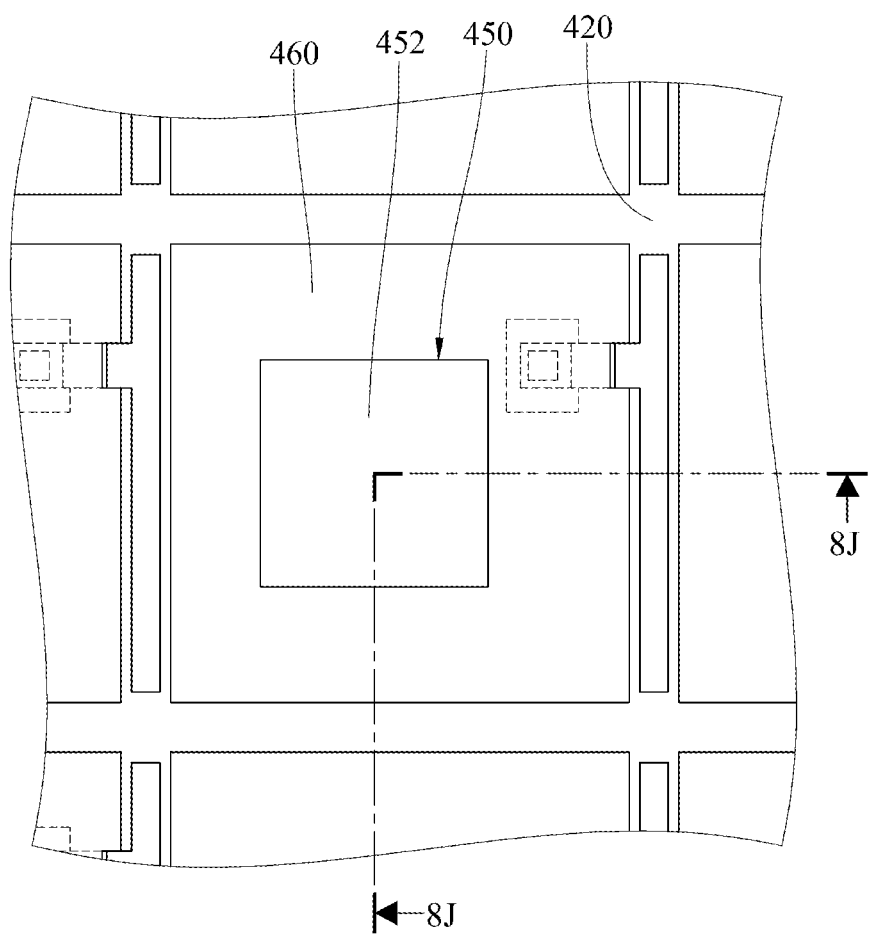
Figure 8J:
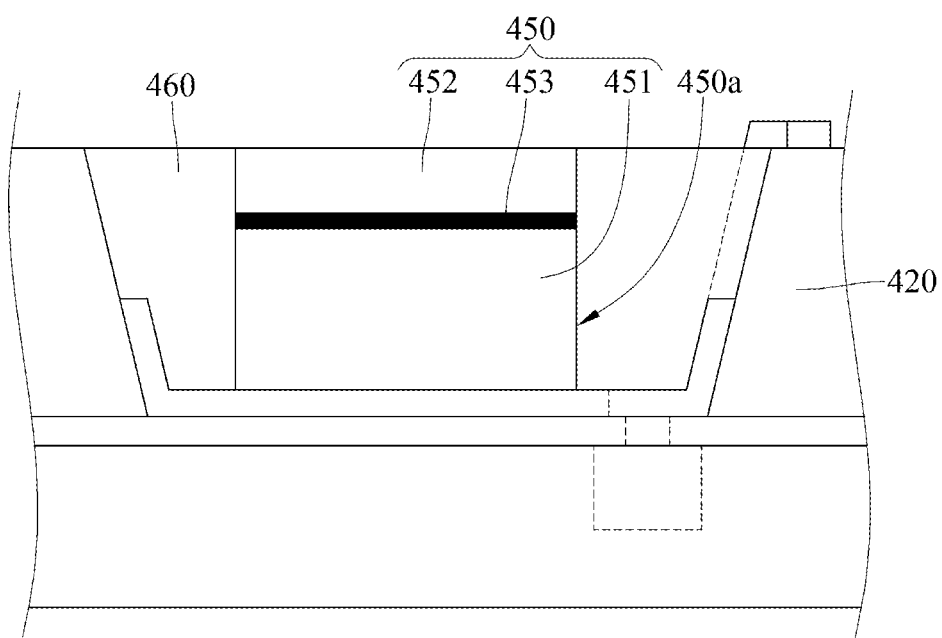
Figure 8K:
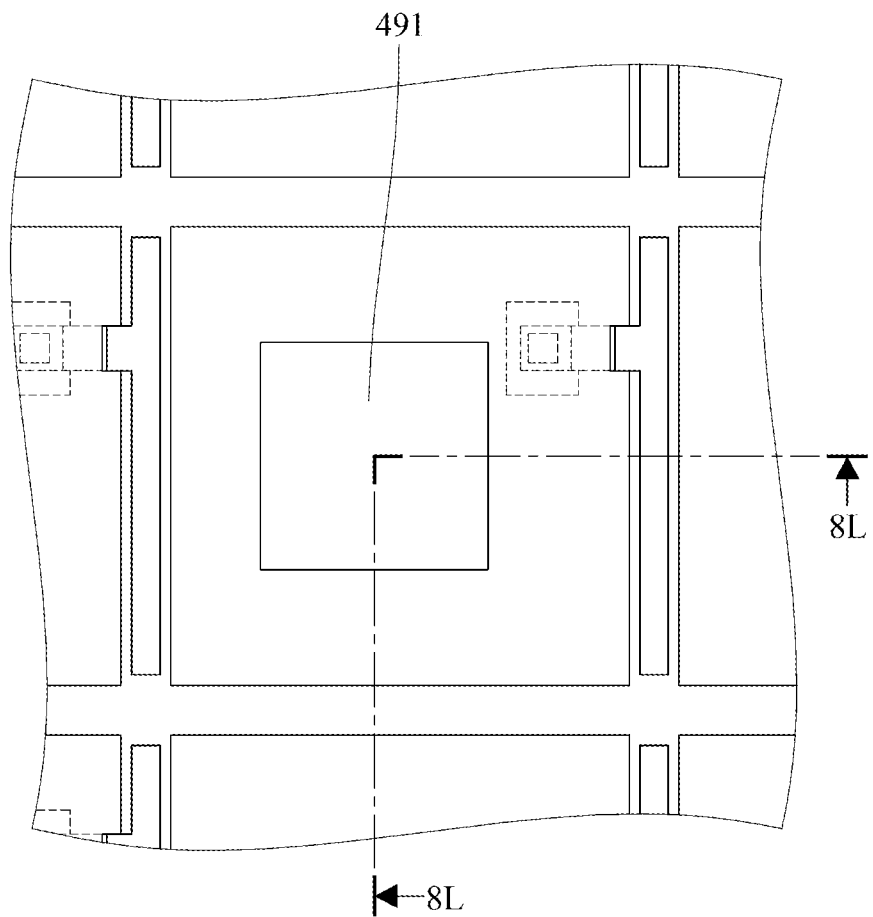
Figure 8L:
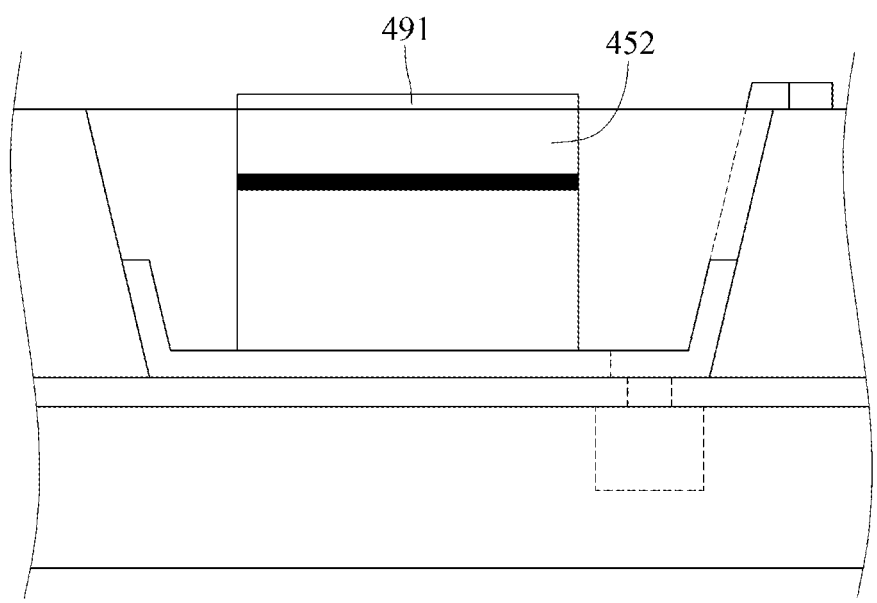
Figure 8M:
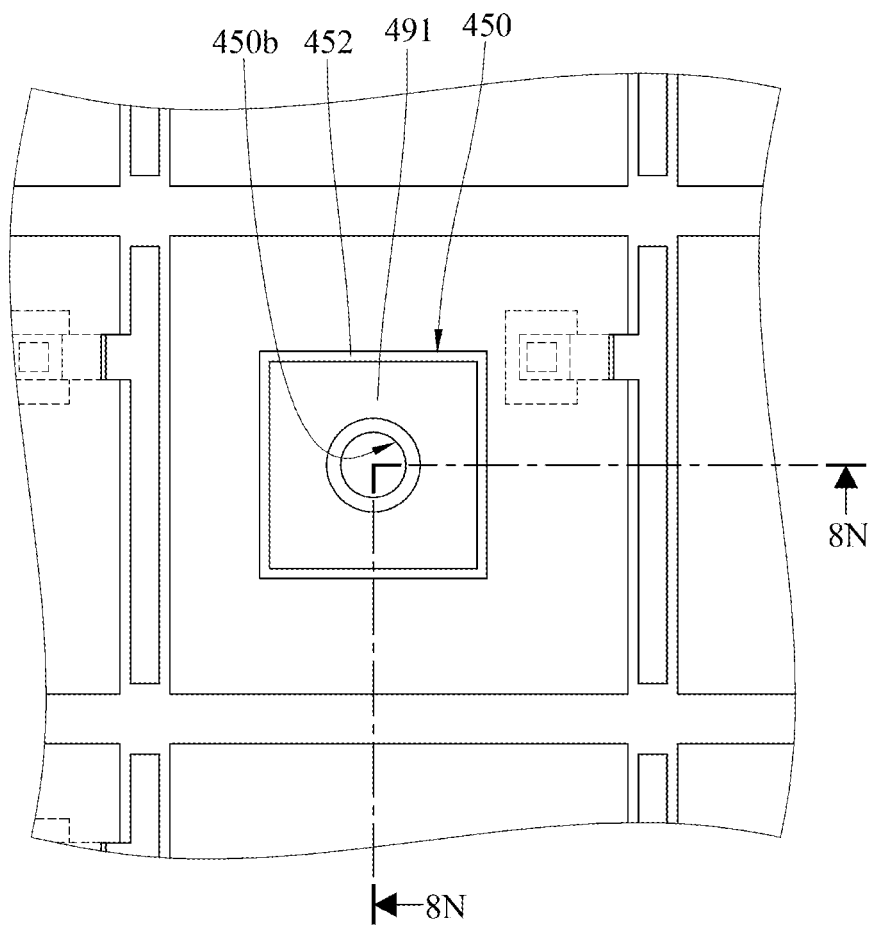
Figure 8N:
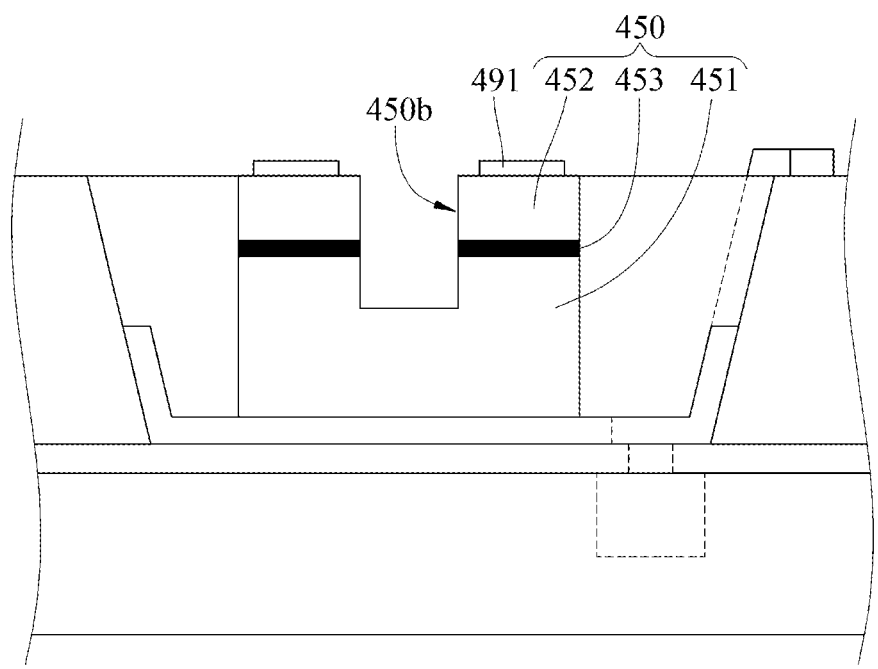
Figure 8O:
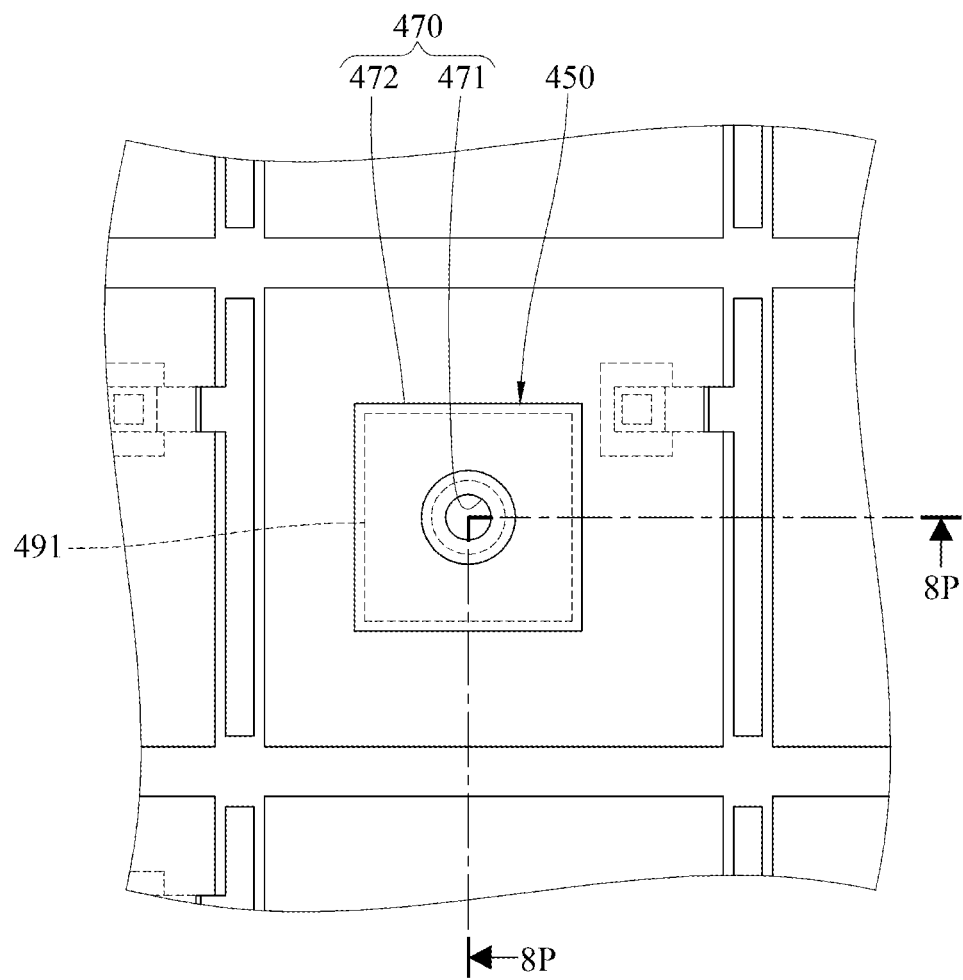
Figure 8P:
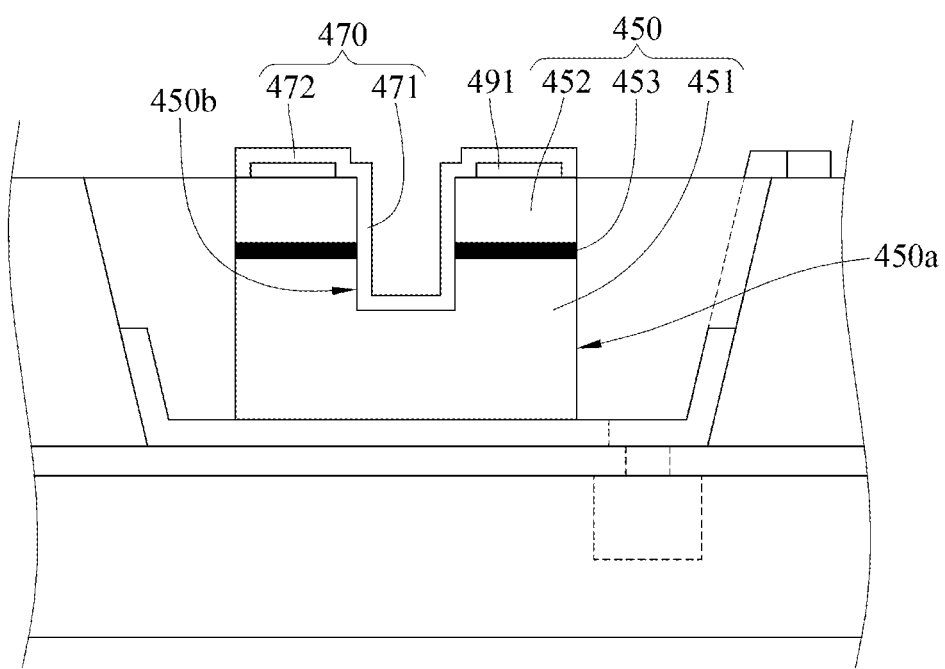
Figure 8Q:
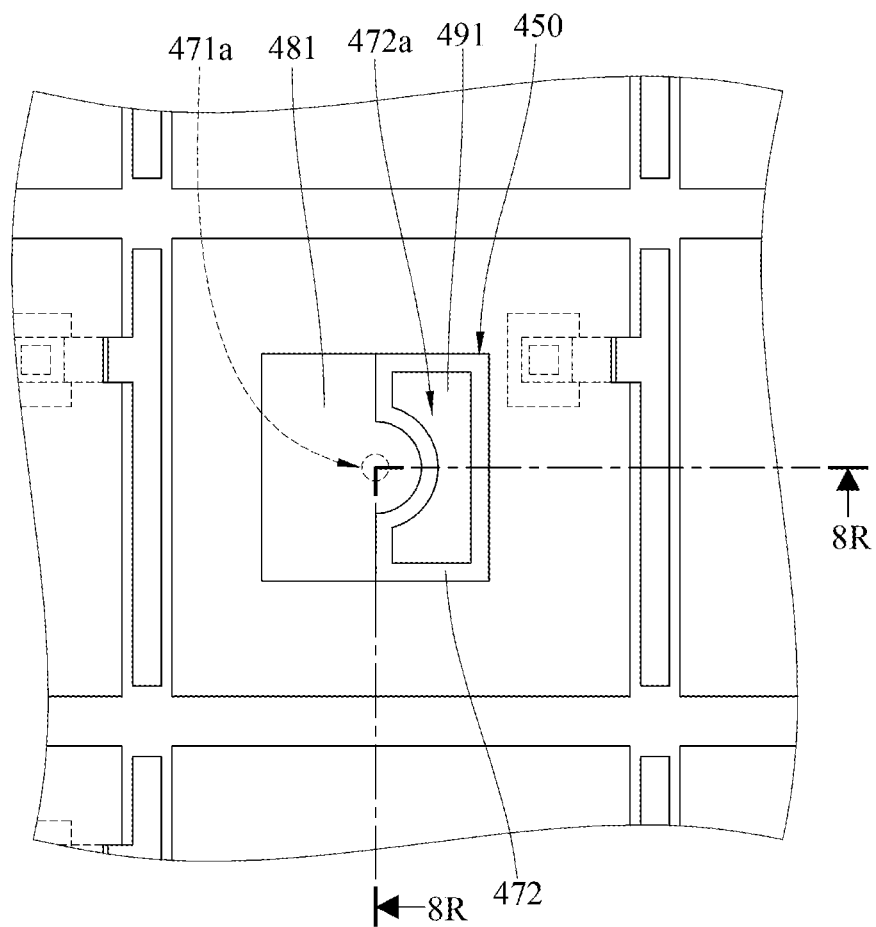
Figure 8R:
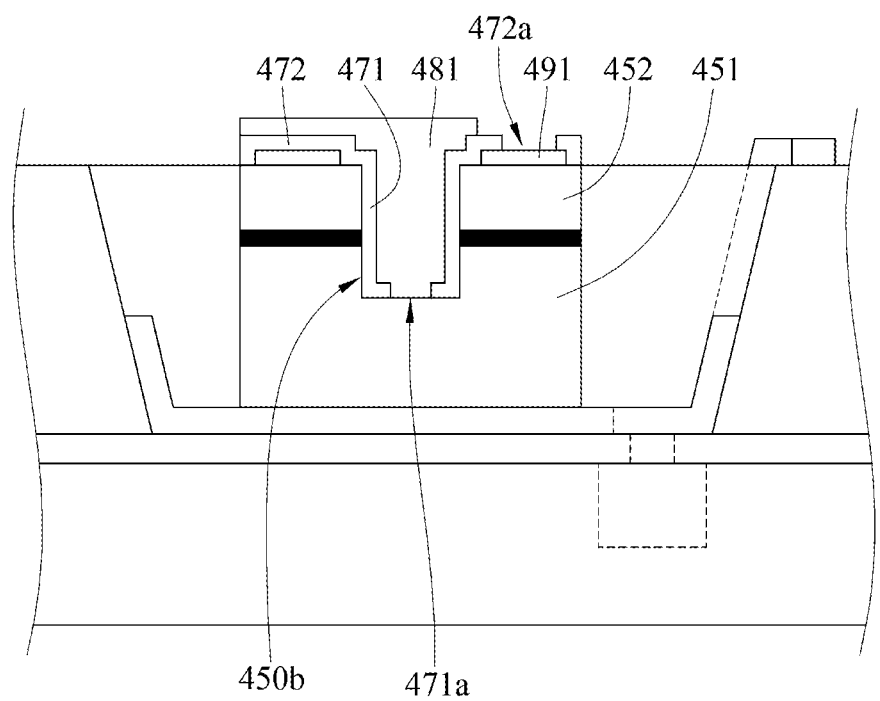
Figure 8S:
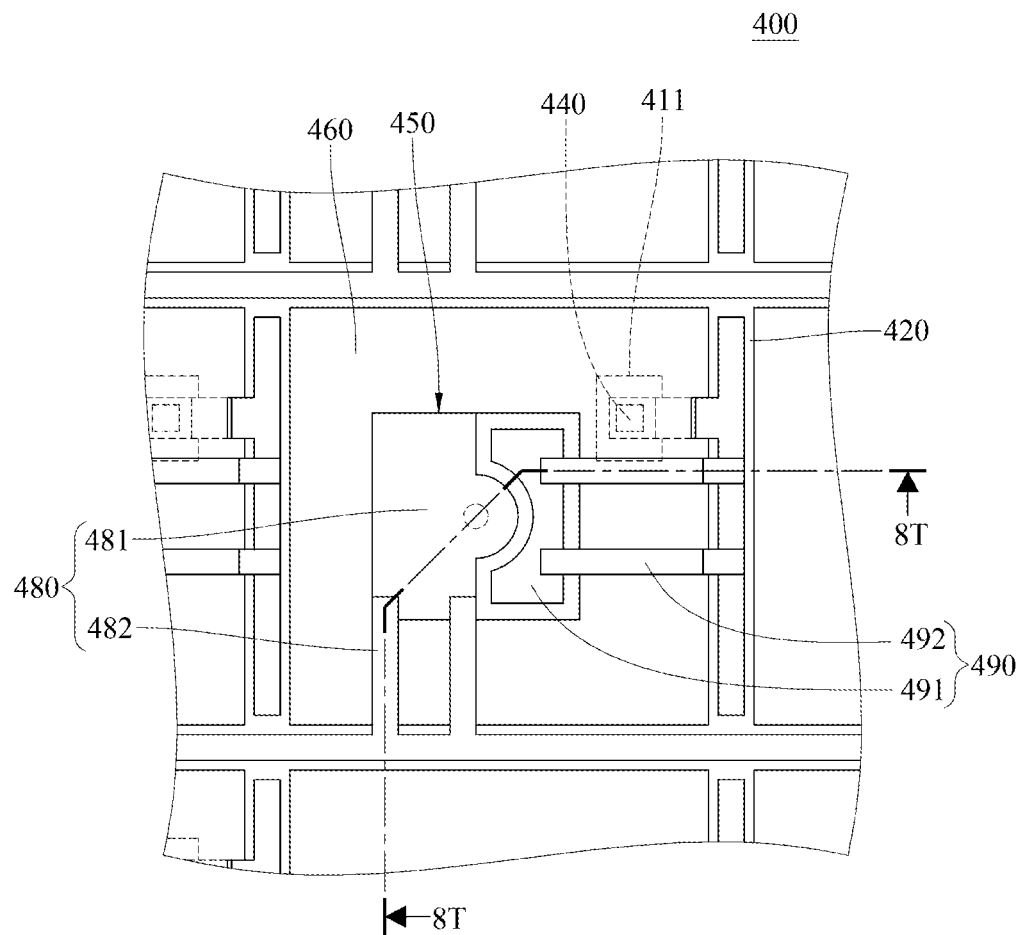
Figure 8T:
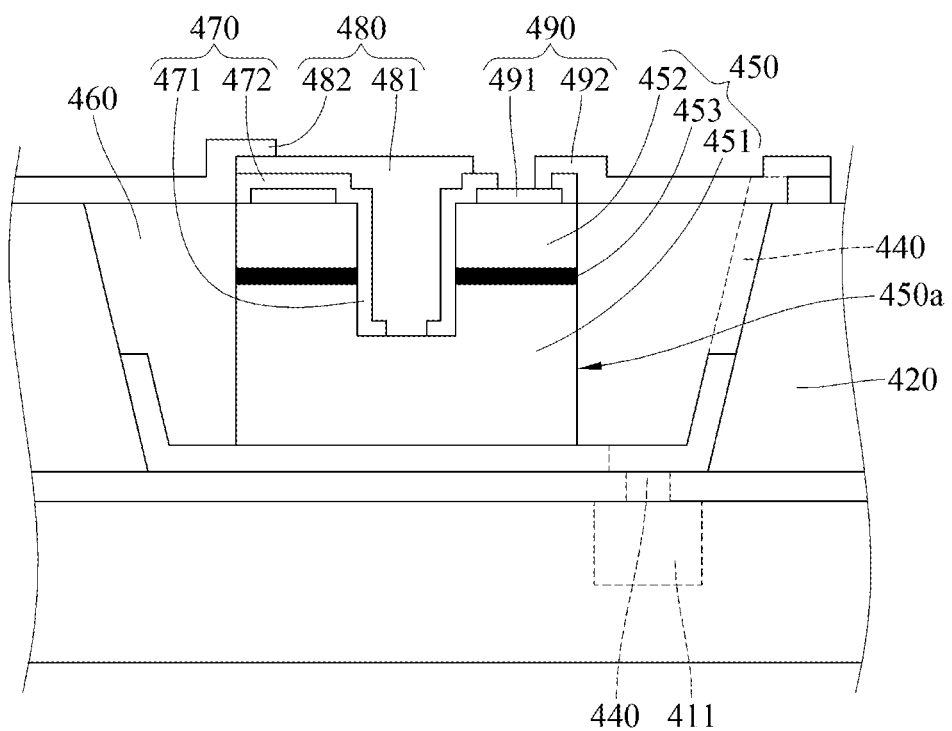

Please refer to FIG. 8A to FIG. 8T, FIG. 8A, FIG. 8C. FIG. 8E, FIG. 8G, FIG. 8I, FIG. 8K, FIG. 8M, FIG. 8O, FIG. 8Q, and FIG. 8S, schematic top-view drawings showing a manufacturing process of another aspect of a light emitting device 400 according to another embodiment, and FIG. 8B, FIG. 8D, FIG. 8F, FIG. 8H, FIG. 8J, FIG. 8L, FIG. 8N, FIG. 8P, FIG. 8R, and FIG. 8T are cross-sectional side-view drawings showing the manufacturing process. For the sake of simplification, in the aspect of the light emitting device 400 in FIG. 8A to FIG. 8T, one light emitting chip 450 and one driving element 411 are disposed inside one partition wall 420, but the present invention is not limited thereto; and the number of partition walls 420, light emitting chips 450, and driving elements 411 may be adjusted as needed.

The manufacturing process shown in FIG. 8A to FIG. 8J is similar to the manufacturing process shown in FIG. 4A to FIG. 4J. As shown in FIG. 8A and FIG. 8B, the substrate 410 comprising the driving element 411 is provided. As shown in FIG. 8C and FIG. 8D, the insulating layer 412 is disposed on the substrate 410, wherein the plurality of through-holes 412a, corresponding to the driving elements 411, is formed in the insulating layer 412. The partition wall 420 is disposed on the insulating layer 412 and surrounds the driving element 411. As shown in FIG. 8E and FIG. 8F, the adhesion layer 430 and the driving electrode 440 are disposed on the insulating layer 412. One end of the driving electrode 440 passes through the insulating layer 412 through the through-hole 412a to be electrically connected to the driving element 411. The other end of the driving electrode 440 extends to the top of the partition wall 420. As shown in FIG. 4G and FIG. 4H, the light emitting chip 450 is disposed on the insulating layer 412 through the adhesion layer 430. The light emitting chip 450 comprises a first semiconductor layer 451 and a second semiconductor layer 452, with a light emitting junction 453 being formed between them. As shown in FIG. 4I and FIG. 4J, the transparent layer 160 is disposed on the substrate 410, located between the light emitting chip 450 and the partition wall 420. The transparent layer 460 may surround and contact a lateral 450a of the light emitting chip 450. The transparent layer 460 may be formed through filling or coating.

As shown in FIG. 8K and FIG. 8L, the second contact portion 491 is laid on the second semiconductor layer 452.

As shown in FIG. 8M and FIG. 8N, an opening 450b is formed downward near the center of the second contact portion 491. The opening 450b passes through the second contact portion 491, the second semiconductor layer 452, and the light emitting junction 453 and extends into the first semiconductor layer 451.

As shown in FIG. 8O and FIG. 8P, the insulating layer 470 is formed on the light emitting chip 450. The insulating layer 470 comprises a first insulating layer 471 and a second insulating layer 472, and these two layers are connected to each other. The first insulating layer 471 is disposed on an inner wall of the opening 450b, and the second insulating layer 472 is disposed on the second contact portion 491. The second insulating layer 472 extends from the first insulating layer 471 to an upper edge of the lateral 450a of the light emitting chip 450. The first insulating layer 471 and the second insulating layer 472 may be formed in any order and may also be formed simultaneously. The insulating layer 470 may be formed through coating, deposition, or passivation.

As shown in FIG. 8Q and FIG. 8R, the first contact portion 481 is formed inside the opening 450b and on a part of the second insulating layer 472. The first contact portion 481 is disposed on about half area of the second insulating layer 472. The first contact portion 481 is electrically connected to the first semiconductor layer 451 through a through-hole 471a passing through the first insulating layer 471. The first contact portion 481 is electrically isolated from the second semiconductor layer 452 through the first insulating layer 471 and is also electrically isolated from the second contact portion 491 through the second insulating layer 472 on the light emitting chip 450. A through-hole 472a is provided on the other half area of the second insulating layer 472 so that the second contact portion 491 is exposed. The area size of the first contact portion 481 located on the second semiconductor layer 452 is close to the area size of the exposed second contact portion 491 on the through-hole 472a. The first contact portion 481 and the second contact portion 491 may be formed through sputtering, electroplating, or deposition.

As shown in FIG. 8S and FIG. 8T, a plurality of first extension portions 482 are formed on the first contact portion 481, and a plurality of second extension portions 492 are formed on the second contact portion 491. The first extension portion 482 is electrically connected to the first contact portion 481. The first extension portion 482 extends from the first contact portion 481, passes over an upper edge of the lateral 450a of the light emitting chip 450, the transparent layer 460, and onto the partition wall 420. The first contact portion 481 and the first extension portion 482 form the first electrode 480. The second extension portion 492 is electrically connected to the second contact portion 491. The second extension portion 492 extends from the second contact portion 491, passes over the upper edge of the lateral 450a of the light emitting chip 450, the transparent layer 460, and to the top of the partition wall 420; and the extension portion 492 is electrically connected to the driving electrode 440, and is further electrically connected to the driving element 411. The second contact portion 491 and the second extension portion 492 form the second electrode 490. The first extension portion 482 and the second extension portion 492 may be formed through sputtering, electroplating, or deposition.

Please refer to FIG. 9, a schematic cross-sectional side-view drawing of a light emitting device 401 according to another embodiment. The light emitting device 401 is similar to the light emitting device 400 in FIG. 7B. The difference includes that, in the light emitting device 401, the first electrode 480 is electrically connected to the first semiconductor layer 451 of the light emitting chip 450 and the driving electrode 440, and thus electrically connected to the first semiconductor layer 451 and the driving element 411. The second electrode 490 is electrically connected to the second semiconductor layer 452 of the light emitting chip 450 and a common voltage source. Thus, the electrical connection from the light emitting chip 450 to the driving element 411 or the common voltage source may be adjusted as needed.

According to the certain embodiments, in the light emitting device and the manufacturing method according to the embodiments, the electrodes are configured to be away from the lateral of the light emitting chip, increasing the light output range of the lateral of the light emitting chip, and thus increasing and improving the light output efficiency of the light emitting device. In addition, the lateral of the light emitting chip may also contact the transparent layer having an refraction index between that of the light emitting chip and that of a vacuum, so that the transparent layer can guide the light emitted from the lateral to the front of the light emitting chip through reflection, refraction, and scattering, and finally increasing and improving the front light output efficiency of the light emitting device.

While the present invention has been disclosed with the above embodiments, these embodiments are not intended to limit the present invention. All alterations and modifications fall within the protection scope of the invention, without departing from the essences and scope of the invention. Regarding the scope of patent protection defined by the present invention, please refer to the appended claims.

What is claimed is:

1. A light emitting device, comprising:
a substrate;
a light emitting chip, comprising:
   a first semiconductor layer, disposed above the substrate, and
   a second semiconductor layer, stacked above the first semiconductor layer and forming a light emitting junction with the first semiconductor layer;
a transparent layer, disposed above the substrate, surrounding and contacting a lateral of the light emitting chip, wherein the transparent layer has a refraction index between that of the light emitting chip and that of a vacuum;
a first electrode, electrically connected to the first semiconductor layer; and
a second electrode, electrically connected to the second semiconductor layer;
wherein the substrate comprises a driving device, the second electrode extends from a surface of the second semiconductor layer, along a space between the lateral of the light emitting chip and the transparent layer, to the substrate, and the second electrode is electrically connected to the second semiconductor layer and the driving device and electrically isolated from the first semiconductor layer on the surface of the second semiconductor layer.

2. A light emitting device, comprising:
a substrate;
a light emitting chip, comprising:
   a first semiconductor layer, disposed above the substrate, and
   a second semiconductor layer, stacked above the first semiconductor layer and forming a light emitting junction with the first semiconductor layer;
a transparent layer, disposed above the substrate, surrounding and contacting a lateral of the light emitting chip, wherein the transparent layer has a refraction index between that of the light emitting chip and that of a vacuum;
a first electrode, electrically connected to the first semiconductor layer; and
a second electrode, electrically connected to the second semiconductor layer;
wherein the substrate comprises a driving device, the first electrode is disposed between the first semiconductor layer and the substrate and extends to the driving device, and the first electrode being electrically connected to the first semiconductor layer and the driving device.

3. The light emitting device according to claim 1, wherein the second electrode is stacked above the second semiconductor layer and the transparent layer, and the transparent layer separates the lateral of the light emitting chip from the second electrode.

4. The light emitting device according to claim 1, wherein the light emitting device further comprises a partition wall surrounding the light emitting chip, wherein the transparent layer is located between the light emitting chip and the partition wall, the first electrode extends from a surface of the first semiconductor layer, along the space between the lateral of the light emitting chip and the transparent layer, to the substrate, and the first electrode further extends onto the partition wall and is electrically isolated from the second semiconductor layer at the lateral of the light emitting chip.

5. The light emitting device according to claim 1, wherein the light emitting device further comprises a partition wall surrounding the light emitting chip, wherein the transparent layer is located between the light emitting chip and the partition wall, and the second electrode is stacked above the second semiconductor layer and the transparent layer and extends onto the partition wall.

6. A light emitting device, comprising:
a substrate;
a light emitting chip, comprising:
   a first semiconductor layer, disposed above the substrate; and
   a second semiconductor layer, stacked above the first semiconductor layer and forming a light emitting junction with the first semiconductor layer;
a first electrode, comprising a first contact portion and a first extension portion, wherein the first contact portion penetrates and electrically isolated from the second semiconductor layer, the first contact portion is further electrically connected to the first semiconductor layer, the first extension portion is stacked above the first contact portion and the second semiconductor layer, and the first extension portion electrically isolated from the second semiconductor layer; and
a second electrode, comprising a second contact portion and a second extension portion, wherein the second contact portion is stacked above the second semiconductor layer, electrically connected to the second semiconductor layer and electrically isolated from the first electrode, and the second extension portion is stacked above the second contact portion.

7. The light emitting device according to claim 6, wherein the first extension portion extends from the first contact portion onto an edge of a lateral of the light emitting chip, the second contact portion substantially occupies an entire surface of the second semiconductor layer and is away from the first extension portion and the first contact portion, and the first extension portion occupies less area on the second semiconductor layer than the second contact portion does.

8. The light emitting device according to claim 6, wherein the second contact portion substantially occupies an entire surface of the second semiconductor layer, a first part of the first contact portion further penetrates the second contact portion, a second part of the first contact portion is laid on a part of the second contact portion and partially covers the second contact portion, and the second part of the first contact portion is electrically isolated from the second contact portion on the light emitting chip.

9. The light emitting device according to claim 6, wherein the device further comprises a transparent layer, disposed on the substrate, surrounding and contacting a lateral of the light emitting chip, wherein the transparent layer exhibits a refraction index between that of the light emitting chip and that of a vacuum.

10. The light emitting device according to claim 9, wherein the first extension portion and the second extension portion extend onto the transparent layer respectively, and the transparent layer separates the lateral of the light emitting chip from the first electrode and from the second electrode.

11. The light emitting device according to claim 9, wherein the light emitting device further comprises a partition wall surrounding the light emitting chip, wherein the transparent layer is located between the light emitting chip and the partition wall, and the first extension portion and the second extension portion extend onto the partition wall respectively.

12. The light emitting device according to claim 6, wherein the first electrode and the second electrode are separated from a lateral of the light emitting chip and are not adhered to the lateral of the light emitting chip therein.

* * * * *